US012075651B2

(12) United States Patent
Fusella et al.

(10) Patent No.: US 12,075,651 B2
(45) Date of Patent: *Aug. 27, 2024

(54) ORGANIC ELECTROLUMINESCENT DEVICES

(71) Applicant: Universal Display Corporation, Ewing, NJ (US)

(72) Inventors: Michael Fusella, Lawrenceville, NJ (US); Nicholas J. Thompson, New Hope, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/130,549

(22) Filed: Apr. 4, 2023

(65) Prior Publication Data

US 2023/0247856 A1 Aug. 3, 2023

Related U.S. Application Data

(63) Continuation of application No. 17/524,994, filed on Nov. 12, 2021, now Pat. No. 11,647,647, which is a
(Continued)

(51) Int. Cl.
*H10K 50/85* (2023.01)
*G02B 5/00* (2006.01)
*H10K 102/00* (2023.01)

(52) U.S. Cl.
CPC .............. *H10K 50/85* (2023.02); *G02B 5/008* (2013.01); *H10K 2102/351* (2023.02)

(58) Field of Classification Search
CPC .. H10K 50/85; H10K 2102/351; H10K 50/13; H10K 50/852; H10K 50/858;
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

CN 106663740 A 5/2017
EP 3172777 A1 5/2017
(Continued)

OTHER PUBLICATIONS

Baldo et al. "Highly efficient phosphorescent emission from organic electroluminescent devices", Nature, vol. 395, pp. 151-154, 1998.
(Continued)

Primary Examiner — Jonathan Han
(74) Attorney, Agent, or Firm — Butzel Long

(57) ABSTRACT

Devices and techniques are provided for achieving OLED devices that include one or more enhancement layers formed at least partially from a plasmonic material exhibiting surface plasmon resonance that non-radiatively couples to an organic emissive material in the organic emissive layer, where a majority of excited state energy is transferred from the organic emissive material to a non-radiative mode of surface plasmon polaritons of the enhancement layer.

20 Claims, 27 Drawing Sheets

Related U.S. Application Data continuation of application No. 16/685,161, filed on Nov. 15, 2019, now Pat. No. 11,201,313.

(60) Provisional application No. 62/772,931, filed on Nov. 29, 2018.

(58) Field of Classification Search
CPC .... H10K 50/11; H10K 59/876; H10K 59/879; G02B 5/008; Y02E 10/549; H01L 51/5262; H01L 2251/558; H01L 51/5265; H01L 51/504; H01L 51/5275; H01L 51/5012
See application file for complete search history.

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 9,496,523 B1 * | 11/2016 | Xiang | H10K 50/858 |
| 9,774,004 B2 * | 9/2017 | Wu | H10K 50/85 |
| 9,960,386 B2 | 5/2018 | Thompson | |
| 2003/0230980 A1 | 12/2003 | Forrest | |
| 2004/0174116 A1 | 9/2004 | Lu | |
| 2016/0204381 A1 * | 7/2016 | Xiang | H10K 50/852 257/40 |
| 2017/0133631 A1 * | 5/2017 | Thompson | H10K 50/131 |
| 2017/0229663 A1 | 8/2017 | Tsai | |
| 2018/0069197 A1 | 3/2018 | Acharya | |
| 2018/0097202 A1 * | 4/2018 | Forrest | H10K 50/854 |

FOREIGN PATENT DOCUMENTS

| | | |
|---|---|---|
| KR | 20170036051 A | 3/2017 |
| WO | 2008057394 A1 | 5/2008 |
| WO | 2010011390 A2 | 1/2010 |
| WO | 2017148110 A1 | 9/2017 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Krishnamoorthy, et al., Topological Transitions in Metamaterials, Science 336, 205 (2012), DOI 10.1126/science. 1219171, downloaded from www.sciencemag.org on Jul. 17, 2014.

An et al., "Surface plasmon mediated energy transfer of electrically-pumped excitons", Mar. 1, 2010, vol. 18, No. 5, Optics Express 4041.

Jin et al., "Optimization of period and thickness of the corrugated Ag cathodefor efficient cross coupling between SPP and microactivity modesin top-emitting OLEDs", vol. 7, No. 6, Jun. 1, 2017, Optical Materials Express 2096.

Galfsky et al., "Directional emission from quantum dots in a hyperbolic metamaterial", CLEO 2014.

Korean Office Action (including English translation) issued in App. No. KR10-2019-0156103, dated Oct. 4, 2023, 8 pages.

Chinese Office Action issued in App. No. CN201911202279, dated Dec. 26, 2023, 7 pages.

* cited by examiner

FIG. 3B          FIG. 3C
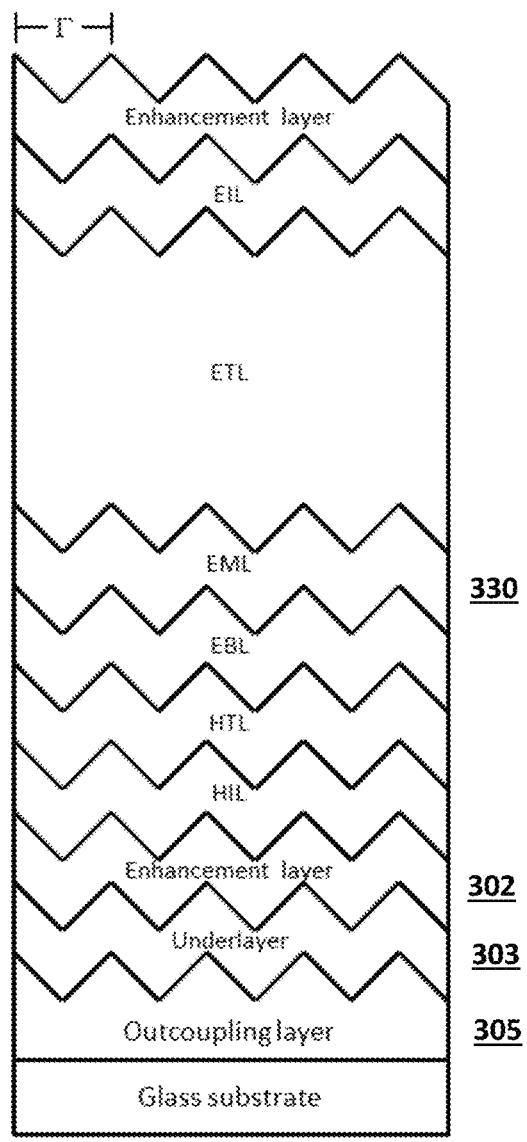
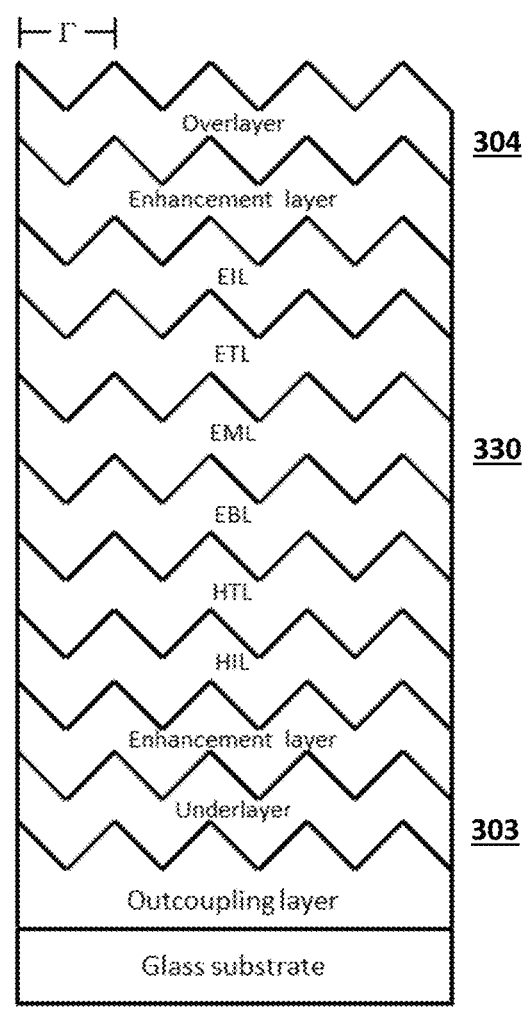

Top view

Side view

ORGANIC ELECTROLUMINESCENT DEVICES

CROSS-REFERENCE TO RELATED APPLICATIONS

This application is a continuation of U.S. patent application Ser. No. 17/524,994, filed Nov. 12, 2021, which is a continuation of U.S. patent application Ser. No. 16/685,161, filed Nov. 15, 2019, which is a non-provisional of U.S. Patent Application Ser. No. 62/772,931, filed Nov. 29, 2018, the entire contents of each of which are incorporated herein by reference.

FIELD

The present invention relates to enhancement layers and related structures for use in organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

In an embodiment, an organic emissive device is provided that includes a substrate; a corrugated outcoupling layer disposed above the substrate; a first electrode disposed over the outcoupling layer; an emissive stack disposed over the first enhancement layer and comprising an organic emissive layer; a second electrode disposed over the emissive stack; and a first enhancement layer comprising a plasmonic material exhibiting surface plasmon resonance that non-radiatively couples to an organic emissive material in the organic emissive layer and transfers the majority of excited state energy from the organic emissive material to a non-radiative mode of surface plasmon polaritons of the enhancement layer.

BRIEF DESCRIPTION OF THE DRAWINGS

FIGS. 3A-3C show several schematics of a corrugated OLED device as disclosed herein. FIG. 3A shows an example device that includes a corrugated structure with pitch Γ. FIG. 3B shows an example device having a corrugated structure including an underlayer beneath a bottom enhancement layer. FIG. 3C shows an example device having a corrugated structure including both an underlayer beneath the bottom enhancement layer and an overlayer atop the top enhancement layer.

FIG. 4A shows an example device with a 10 nm Al/Ag anode; FIG. 4B shows an example device with a 34 nm Al/Ag anode; FIG. 4C shows an example device with a 14 nm Al anode; and FIG. 4D shows an example device with a 24 nm Al anode.

FIG. 6A is a plot of the difference in P and S polarizations (P-S), with the P-S plot of an identical-in-structure but non-corrugated (i.e., planar) control device subtracted off. FIG. 6C is a P-S plot without the planar control subtracted. FIGS. 6B and 6D are plots of intensity vs. wavelength at a fixed angle of 18 degrees off normal incidence (identified by white dashed lines) for the contour plots in FIGS. 6A and 6C, respectively.

FIG. 7A is for a device having an underlayer with index n<1.7 and a 24 nm Ag anode. FIG. 7B is for a device having an underlayer with index n<1.7 and a 64 nm Ag anode. FIG. 7C is for a device having an underlayer with index n>1.7 and a 24 nm Ag anode. FIG. 7D is for a device having an underlayer with index n>1.7 and a 64 nm Ag anode. All example anodes in FIGS. 7A-7D utilize a 1 nm Al adhesion layer. The white vertical line identifies the crossing wavelength of the dispersive mode for the 24 nm thick Ag anode. These plots depict the difference between the P and S polarization intensities (i.e., P-S) and have had an additional background subtraction of a planar version of the identical OLED structure as disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
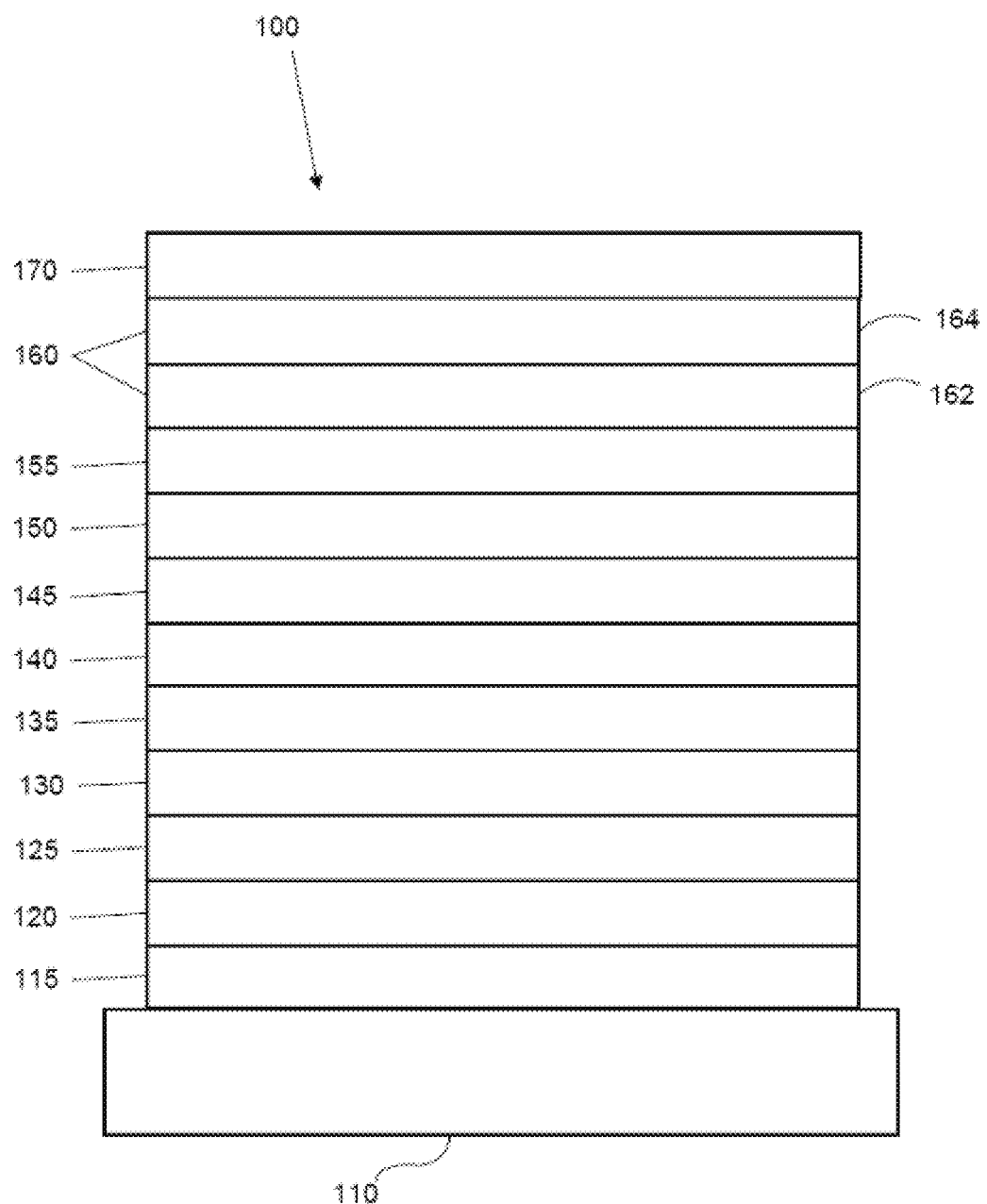
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
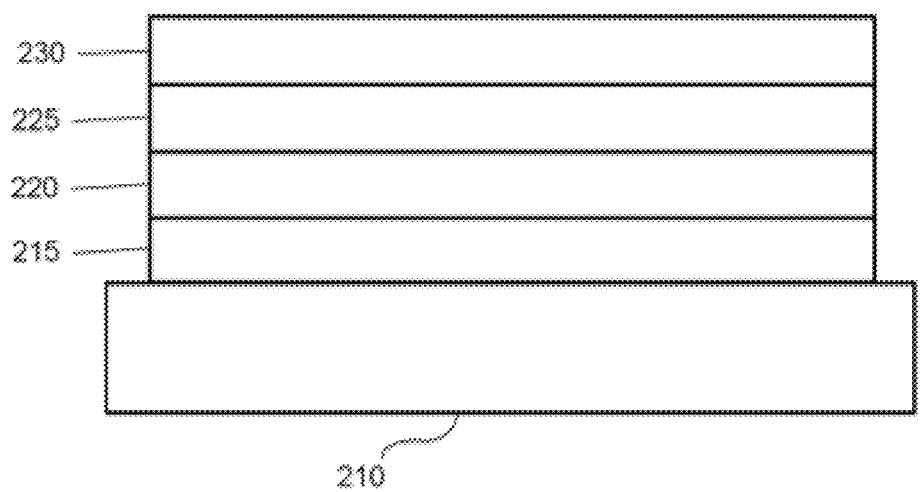
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer"

disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

It has been found that, in contrast to conventional teachings that attempt to prevent or inhibit exciton energy transfer to non-radiative modes of surface plasmon polaritons (SPPs) in metal electrodes, it may be beneficial to transfer as much energy as possible to these non-radiative modes and then extract the energy to free space as emitted light through the use of outcoupling layers. This is contrary to conventional understandings in the art because such energy typically is lost in conventional device structures. Specifically, in organic light emitting diode (OLED) devices, placing the emissive layer (EML) within a threshold distance of the metal electrodes will couple the excited state energy of the electrically-excited excitons into the surface plasmon resonant (SPR) mode of an enhancement layer, which may be or include the metal electrode. Conventionally, such an arrangement is considered to be an energy loss pathway and therefore undesirable. However, embodiments disclosed herein make use of this energy pathway to increase device lifetime by decreasing the time that an exciton resides on the emitter molecule.

It has been found that methods and arrangements that outcouple energy in the form of light from the SPR mode may be beneficial in obtaining OLEDs that have longer lifetimes at display luminance levels.

Examples of devices, outcoupling layers, enhancement layers, and device structures that make use of this effect are provided in U.S. Pat. No. 9,960,386, the disclosure of which is incorporated by reference in its entirety.

As disclosed herein, it has further been found that a method for outcoupling light from SPR modes is to corrugate the OLED stack. As such, in an aspect of the present disclosure, a corrugated outcoupling layer and/or other corrugated layers may be used in an OLED stack that allows for energy transfer to the SPR modes.

In another aspect of the present disclosure, corrugated OLED structures are provided in which the outcoupling properties may be tuned with an underlayer adjacent to the plasmonic film. For example, at least the following tuning capabilities may be achieved: increased spectral width achieved by increasing the surface roughness of the underlayer; and changing the spectral position of the outcoupling by tuning the refractive index of the two layers adjacent to the plasmonic layer (below and above). In another aspect of the present disclosure, 3D corrugation patterns may be used to enhance the SPR mode outcoupling efficiency.

In another aspect of the present disclosure, an OLED that incorporates an SPR outcoupling mechanism is provided that minimizes light emission that isn't coupled to the enhancement layer. Because the emission resulting from excitons close enough to couple to the enhancement layer will age more slowly than emission from excitons far from the enhancement layer, eliminating light from excitons which are too far away to couple to the enhancement layer will result in consistent emission intensity over time and increased device operational lifetime. This will provide improved pixel color accuracy over the product's life, especially in comparison to conventional device structures that limit or inhibit energy transfer to SPP modes. By incorporating a thin film of material beneath the anode or atop the cathode, it also is possible to tune the energy of the outcoupled SPR mode and the total emission of the device without changing the EML composition.

Embodiments disclosed herein also may provide device structures that may increase the spectral range accessible to outcoupling the SPR mode in a corrugated OLED structure. Specifically, aspects of the present disclosure may provide techniques and device structures that reduce the angular dependence of outcoupled light, and which allow for tuning the energy and full-width half-maximum (FWHM) of the outcoupled light from the SPR mode. Advantages of these tuning methods include tuning the FWHM to match a certain device specification, such as color point, and the ability to tune the energy of the emission without changing the emissive layer composition/doping or the corrugation pitch of the outcoupling layer.

To address the limitations of outcoupling the emission from an emitter with a large spectral width with a grating mode that is typically narrow, another aspect of the present disclosure provides device structures and techniques to outcouple light from multiple distinct SPR modes, such as two individual SPR modes. For example, the index of refraction and extinction coefficient (n, k) of the metal and adjacent dielectric material may be dissimilar for the cathode and anode in a corrugated OLED. In this case, the outcoupling wavelength of the anode and cathode grating outcoupling wavelength at normal incidence will be dissimilar. A single EML which spectrally overlaps with both outcoupling wavelengths and is within a threshold distance of both the anode and cathode would then be outcoupled by both surface plasmon modes. Applications for this technique include general illumination devices and other lighting effects, where maximizing the spectral outcoupling is desired for efficiency and CRI.

Figure 3A:
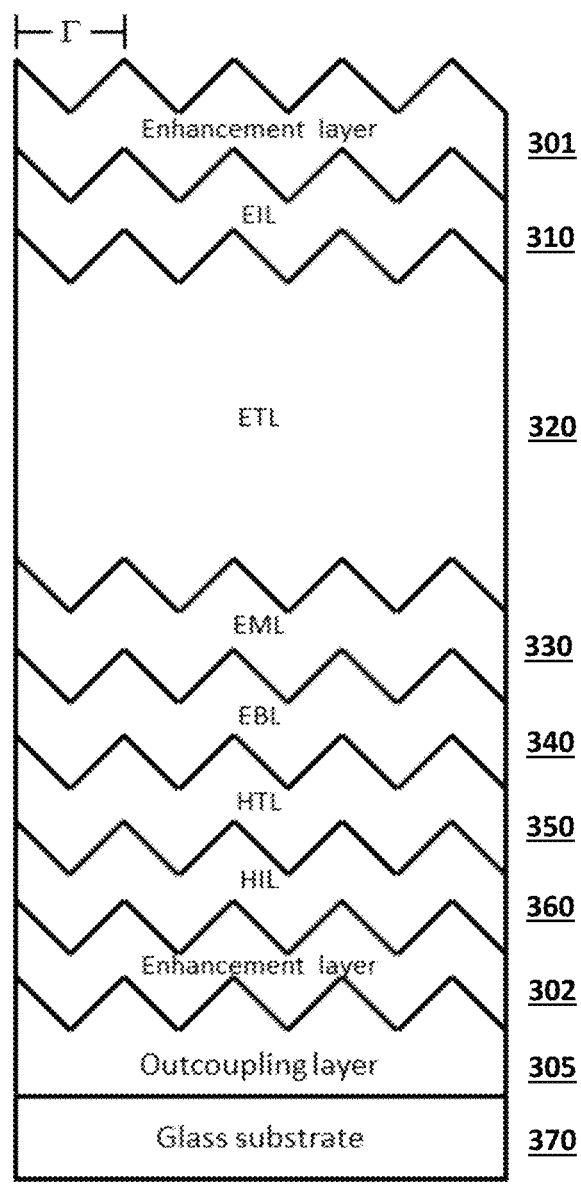

FIGS. 3A-3C show example corrugated OLED device structures as disclosed herein.

FIG. 3A shows a schematic representation of an OLED having a corrugated structure as disclosed herein. The example device includes enhancement layers 301, 302, each of which may be part of, or may include, or may be an electrode of the device. For example, each of the layers 301, 302 shown may be a cathode or an anode of the OLED device, corresponding to the anode 115 and/or cathode 160 shown in FIG. 1. As used herein, an enhancement layer refers to a layer that includes at least one plasmonic material that exhibits surface plasmon resonance that non-radiatively couples to an organic emissive material in an emissive layer of the device. In embodiments disclosed herein, it may be preferred for an enhancement layer to transfer the majority of excited state energy, i.e., more than 50% of the excited state energy, from the organic emissive material to a non-radiative mode of surface plasmon polaritons of the enhancement layer. As disclosed in further detail herein, it has surprisingly been found that this relatively high percentage of energy transfer to SPR modes may provide for enhanced tunability and other desirable qualities of an OLED device, contrary to conventional understanding of such non-radiative modes. Further description of such coupling mechanisms is provided in U.S. Pat. No. 9,960,386, the disclosure of which is incorporated by reference in its entirety.

The device may include one or more of other OLED layers corresponding to the same layers as described with respect to FIGS. 1-2, such as electron injection layers (EILs) 310, electron transport layers (ETLs) 320, emissive layers (EMLs) 330, electron blocking layers (EBLs) 340, hole transport layers (HTLs) 350, hole injection layers (HILs) 360, and a substrate 370. Other than the physical shape resulting from corrugation of the underlying outcoupling layer 305, such layers may be the same as the layers described with respect to FIGS. 1-2, and may use the same materials, fabrication techniques, interfaces, and the like. The outcoupling layer 305 may outcouple energy from one or more SPR modes into light, such as via emission through the substrate 370 or the top of the device. Generally, one or both of the enhancement layers 301, 302 may be used in a device as disclosed herein.

In the example shown in FIG. 3A, the outcoupling layer may be a corrugated epoxy and the corrugation may propagate through the whole device stack as shown. In other configurations, the corrugation may be provided by a separate structure or layer below the outcoupling layer, and/or the corrugation may or may not propagate through the entire stack. The structure may be a one-dimensional (1D) corrugation, such as where ridges extend across the surface of the underlying layer but the height of the corrugation layer, in this example provided by the outcoupling layer, is constant in one direction across the substrate for any given point selected across an orthogonal direction. That is, in the example shown, the ridges of the outcoupling layer may extend with the same shape across the substrate and "into the page" of the illustration. As disclosed in further detail herein, the placement and arrangement of the outcoupling layer and enhancement layer(s) may be used to tune output of the device while capturing energy from SPR modes via the enhancement layer(s).

The outcoupling layer serves to remove the captured energy from the enhancement layer and couple it into free-space in the form of light. Placing the outcoupling layer within close proximity to the enhancement layer may increase the coupling of energy from the enhancement layer to free space. In embodiments disclosed herein, the preferred distance between the enhancement layer and the outcoupling layer is 0 to 50 nm, more preferably, 0 to 30 nm, more preferably 0 to 15 nm, more preferably 0 to 5 nm. An example outcoupling layer may be corrugated epoxy or some other form of device corrugation, in which the corrugation propagates through the whole device stack as previously disclosed. The corrugated outcoupling layer may have a pitch selected to achieve specific effects as disclosed herein. As a specific example, the outcoupling layer may have a pitch of 300-350 nm, 250-400 nm, 200-500 nm, or 150-600 nm.

An outcoupling layer as disclosed herein also may be formed from a patterned 2D and/or 3D dielectric gratings or similar structure. For example, a patterned outcoupling layer composed of all dielectric materials can outcouple light through Bragg or Mie scattering. Such a structure has materials of differing dielectric constant in the x-y plane, not the z-plane. The dielectric outcoupling layer may be patterned in 2D or 3D. It may be preferred for the difference in the real part of the refractive index between the two materials to be between 0.1 to 3, more preferably from 0.3 to 3.

For 2D patterning, the preferred pitch may be 10-6000 nm with a 10-90% duty cycle, more preferably a 20-1000 pitch with a 30-70% duty cycle. For 3D patterning the preferred pattern may be a pitch of 10-6000 nm with a 10-90% duty cycle, more preferably a 20-1000 pitch with a 30-70% duty cycle in the x-direction and a 10-6000 nm pitch with a 10-90% duty cycle, more preferably a 20-1000 pitch with a 30-70% duty cycle, in the y-direction.

Instead of linearly patterned grating, the dielectric material may also be patterned into a bullseye grating as an outcoupling layer. A bullseye grating couples the energy in the enhancement layer out to free space. The preferred pitch and refractive indices for coupling with an enhancement layer built into an OLED are 10 to 6000 nm and 1.3 to 4 respectively.

Dielectric outcoupling gratings may be fabricated as chirped gratings where the periodicity of the structure varies as a function of distance across 1 dimension. The preferred structure for coupling with the enhancement layer within an OLED is where the grating has a fundamental period of between 10 to 2000 nm and increases by 10-60% per period.

2D and 3D grating outcoupling layers, in addition to the 1D corrugated grating outcoupling layer previously disclosed, may all be backfilled with any material with a real part of the refractive index between 1.0 to 4 to make them planar. Planar outcoupling layers may serve to improve OLED yield compared to their corrugated counterparts.

Regardless of the specific arrangement of the corrugation in the outcoupling layer or other layer, the corrugation profile may propagate through one or more other layers of the OLED device, as shown in FIG. 3. That is, one or more layers disposed over the corrugated outcoupling layer may have generally, essentially, or identically the same profile as the corrugated layer, including the RMS roughness, pitch, spacing, and other physical attributes of the corrugation profile. As a specific example, the emissive stack including the emissive layer and other organic layers may have a corrugated profile that has the same pitch as the corrugated outcoupling layer, or a pitch that is otherwise defined by the pitch of the corrugated outcoupling layer. In some embodiments, a planarizing layer may be disposed over the corrugated OLED device to provide a planar surface for other subsequent layers or structures.

FIG. 3B shows a corrugated OLED structure according to an embodiment disclosed herein. The example device may include some or all of the layers previously disclosed with respect to FIG. 3A, as well as an additional underlayer 303 placed between the corrugated outcoupling layer 305 and the bottom enhancement layer 302. The underlayer 303 may provide another mechanism for spectral and efficiency tuning of the outcoupling of the surface plasmon mode in a plasmonically active enhancement layer and/or electrode, such as an adjacent anode. FIG. 3C shows a similar device that includes an additional overlayer 304 disposed over the upper enhancement layer. The overlayer 304 may further enable spectral and efficiency tuning of the outcoupling of the surface plasmon mode of the upper enhancement layer. Each of the underlayer and the overlayer may be used alone or in conjunction with the other. Each layer may include one or more components, including a mixture of materials, a stack of materials, or an alloy of materials. Furthermore, placing the EML 330 within a threshold distance of each of the enhancement layers 301, 302 may speed up the excited state transient lifetime even further than placing the EML within a threshold distance of only one of the layers. For example, where the enhancement layer 301, 302 also include, provide, or are a part of the cathode and anode of the OLED device, the EML may be disposed within the threshold distance of each of the cathode and the anode.

As used herein, the "threshold distance" between the emissive layer and an enhancement layer, such as an electrode, refers to the distance at which the total non-radiative decay rate constant is equal to the total radiative decay rate constant. In some embodiments disclosed herein, it may be preferred for the emissive layer to be disposed within the threshold distance of one or both enhancement layers in a corrugated OLED device. For example, the emissive layer may be disposed within the threshold distance of each of the anode and the cathode, where the two electrodes are configured to be enhancement layers as disclosed herein. The threshold distance may be understood and defined for a given pair of light emitting material and enhancement layer. For any such pair, there is a total nonradiative decay rate constant and a total radiative decay rate constant. As the light emitting material layer approaches the enhancement layer, the non-radiative decay rate constant increases differently than the radiative decay rate constant. At some distance, for the first time the total nonradiative decay rate constant of the light emitting material in the presence of the enhancement layer is equal to the total radiative decay rate constant of the light emitting material in the presence of the enhancement layer. This distance may be defined as the threshold distance. For distances closer to the enhancement layer than this distance, the total non-radiative decay rate is larger than the radiative decay rate and the quantum yield is less than 0.5 or 50%. For distances larger than the threshold distance, the total radiative decay rate constant is larger than the total non-radiative decay rate constant; however, the quantum yield of the light emitting material is reduced compared to the case when the enhancement layer is not present. Light emission is still quenched; however, this quenching can still benefit the device when the outcoupling layer is introduced as it will be recovered as light. Further, the speed up of emission due to the increased rate constants can increase the operational stability of the device.

The physical values of the threshold distance disclosed herein depends on a number of factors including the frequency of the surface plasmon polariton, oscillator strength of the light emitting material, the orientation of the transition dipole moment of the light emitting material, and the dielectric constant of the light emitting material layer. Therefore, by selecting a suitable set of materials for the organic light emitting material and the plasmonic material of the enhancement layer, the threshold distance can be adjusted.

The threshold distances at which the total nonradiative decay rate constant of the light emitting material in the presence of the enhancement layer is equal to the total radiative decay rate constant of the light emitting material in the presence of the enhancement layer and related calculations are discussed in further detail in U.S. Pat. No. 9,960,386, the disclosure of which is incorporated by reference in its entirety.

As a specific example, an embodiment disclosed herein provides SPR mode outcoupling by using a corrugated OLED stack as shown in FIG. 3B. The structure includes a glass substrate, a plasmon outcoupling layer of corrugated epoxy with a pitch of Γ=320 nm; a 100 nm underlayer of a particular refractive index; a bottom enhancement layer that includes an anode including a 64 nm silver (Ag) thin film with 1 nm aluminum (Al) adhesion layer; an organic stack including a 5 nm hole injection layer, a 5 nm hole transport layer, a 5 nm electron blocking layer, a 10 nm emissive layer (EML) that includes a host doped with an emitter at 12% concentration, a 59 nm electron transport layer, and a 1 nm electron injection layer; and a top enhancement layer including a cathode formed from a 1 nm Al adhesion layer and 100 nm of Ag. The device structure is consistent with FIG. 3B, where the EML is within a threshold distance from the plasmonically active bottom (anode) enhancement layer.

One technique when using the plasmonic mode of a corrugated metal to increase device operating lifetime of an OLED is use a metal thickness within a specific range. For example, it has been found that metal layers that are too thin either (1) do not possess large optical densities of states, or (2) are not smooth enough for strong surface plasmon resonance. Conversely, layers that are too thick may inefficiently outcouple light. This is a surprising result since conventional calculations suggest that thin metals increase the optical density of states (ODOS) due to the ability to access states on the backside of the metal. Experimentally, however, metal growth and film coalescence considerations of an evaporated film dictate that a practical minimum metal film thickness exists.

FIG. 4 shows a contour plot of the P polarized electroluminescence (EL), minus the S polarized EL, as a function of angle and wavelength. The process used to generate this type of figure is disclosed in further detail herein. The four plots represent two different metals and two different thicknesses. Each plot shows two relevant features. First, the 'X' shape shows light that is diffracted from the grating mode of the anode. The second feature is the broad featureless emission centered at 550 nm and occurring through all angles. This is intrinsic emission from the emitter that is not coupled to a surface plasmon mode or grating mode. The relative ratio of EL intensity outcoupled by the grating to the amount attributable to the intrinsic emission of the emitter demonstrates the combined in- and out-coupling efficiency of the emitter to the plasmonically active anode. Using this ratio, it can be determined that the Ag anode must be at least ~34 nm thick in order to possess a large enough optical density of states necessary for strong surface plasmon resonance.

Figure 4A:
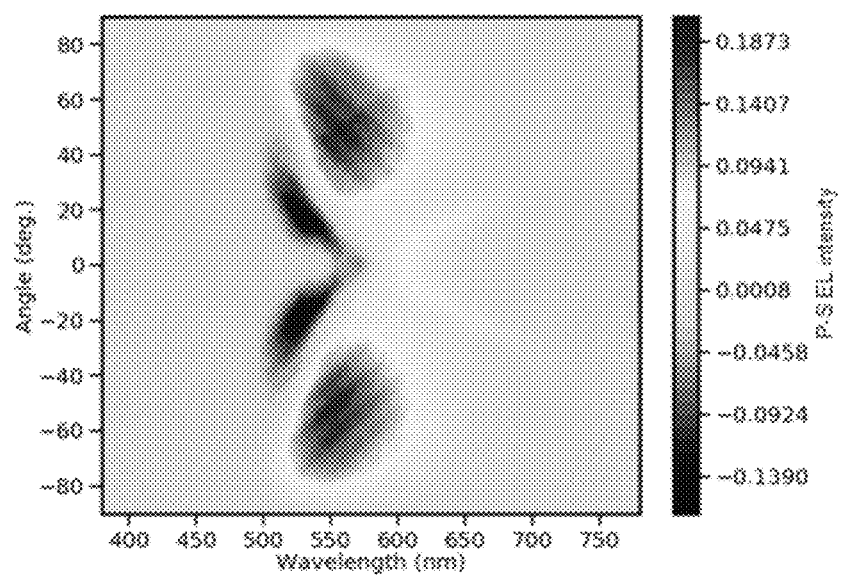
FIGS. 4A-4D show several intensity contour plots of the angle-dependent electroluminescent emission spectrum for corrugated OLED devices where the emissive layer is placed within a threshold distance of the anode, but greater than a threshold distance from the cathode, according to embodiments disclosed herein.
Figure 4B:
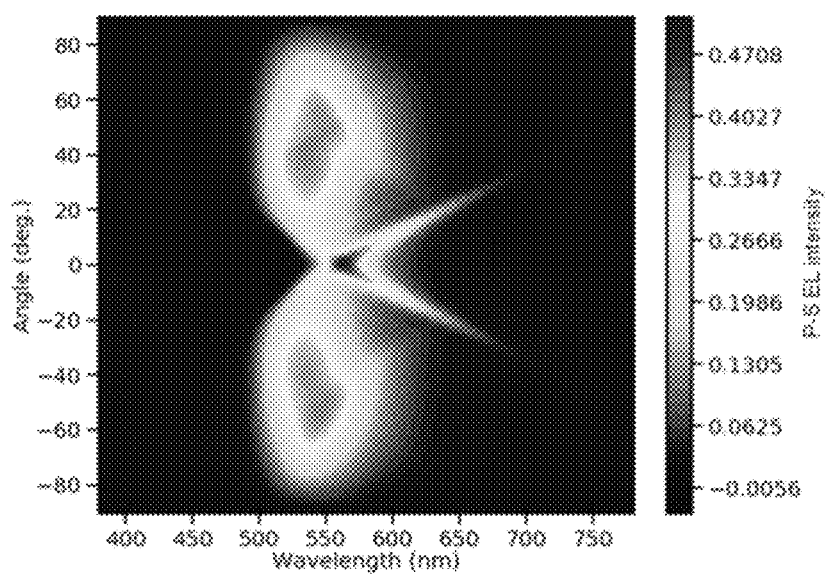

Similarly, thinner anodes may demonstrate a relatively weak outcoupling intensity of the plasmon mode relative to the background emission intensity. This can be observed in FIGS. 4A and 4B. In FIG. 4A, the Ag anode is only 10 nm thick and the broad featureless emission intensity is comparable to the 'X' formed from the grating outcoupled light. However, in FIG. 4B, where the Ag anode is 34 nm thick, the Ag anode exhibits strong SPR mode resonance and the 'X' feature is significantly stronger than the background. However, Ag anodes above approximately 65 nm may significantly reduce the number of photons able to escape the device. In a separate example device configuration identical to the one just described except for utilizing a pure Al anode instead of Ag, it was found that the Al anode must be at least about 24 nm thick to possess a large enough ODOS which is believed to be required for acceptably strong surface plasmon resonance.

Figure 4C:
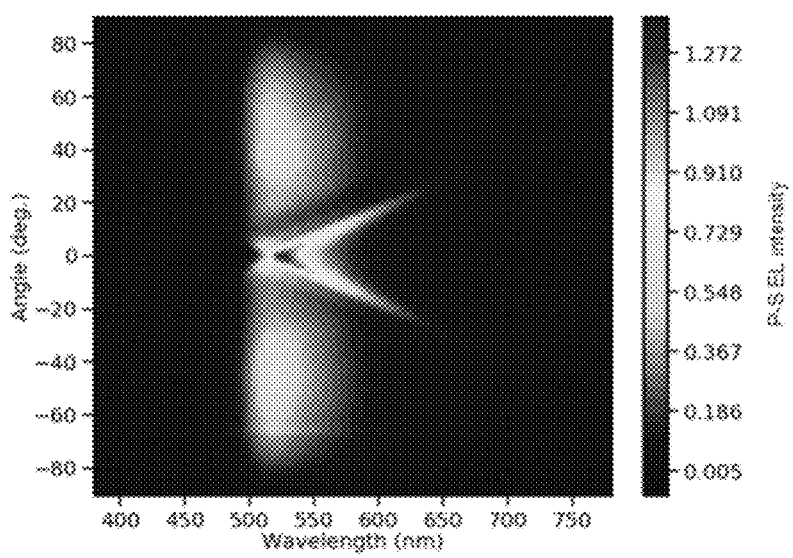
Figure 4D:
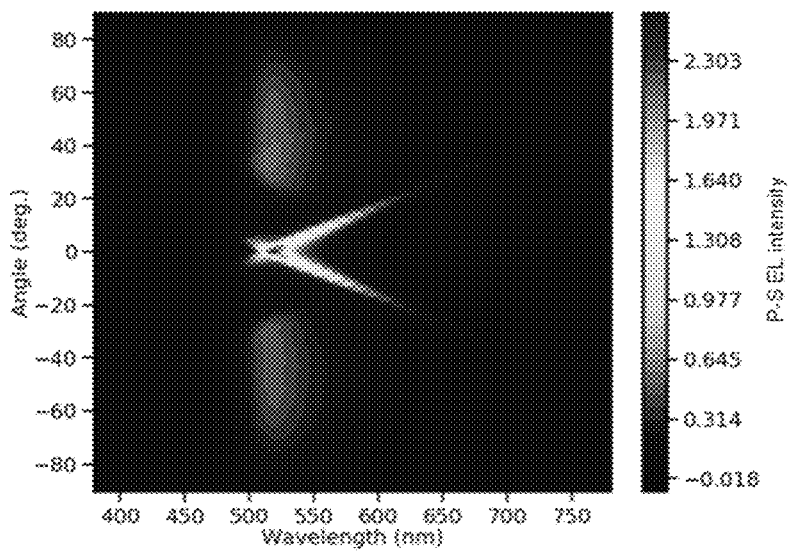

However, Al anodes above approximately 50 nm may significantly reduce the amount of photons able to escape the device. FIG. 4C shows a 14 nm Al anode that does not as strongly exhibit SPR mode resonance as a 24 nm thick Al anode (FIG. 4D). This is evidenced by the intensity of the dispersive mode being on-par with the background emission lobes left behind in this P-S intensity plot for the 14 nm Al anode, whereas the 24 nm Al anode yields a dispersive mode intensity much stronger than the background emission lobes. Therefore, the anode thickness can be used as a means of increasing the optical density of states to enhance SPR mode resonance.

Figure 5A:
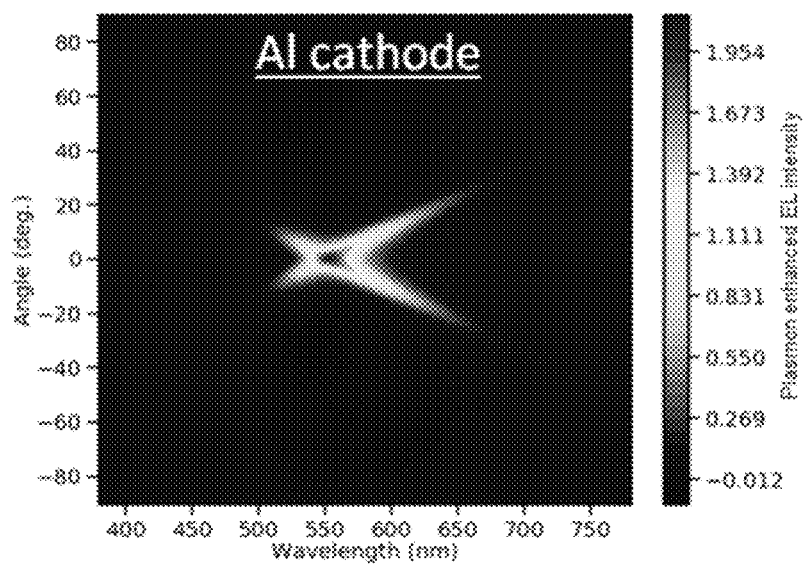
FIGS. 5A-5D show several intensity contour plots of the angle-dependent electroluminescent emission spectrum for corrugated OLED devices where the emissive layer is placed within a threshold distance of the cathode, but greater than a threshold distance from the anode according to embodiments disclosed herein, with various cathode materials: Al (FIG. 5A), Al (1 nm)/Ag (FIG. 5B), Ag (FIG. 5C), and Mg:Ag 10% (FIG. 5D). These plots depict the difference between the P and S polarization intensities (i.e., P-S) and have had an additional background subtraction of a planar version of the identical OLED structure as disclosed herein.
Figure 5B:
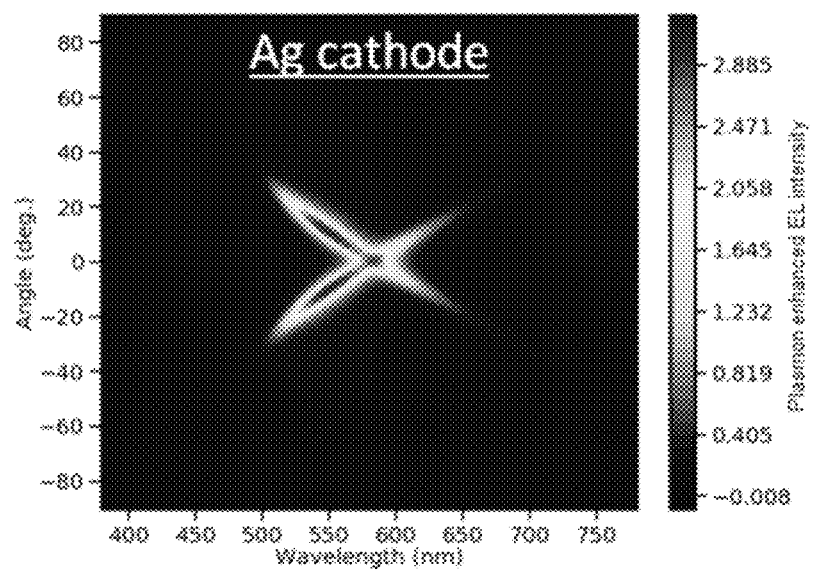
Figure 5C:
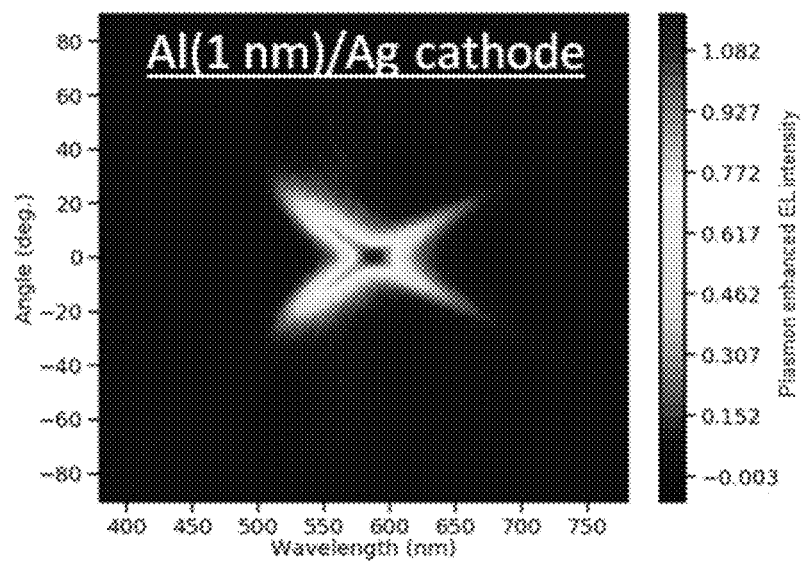
Figure 5D:
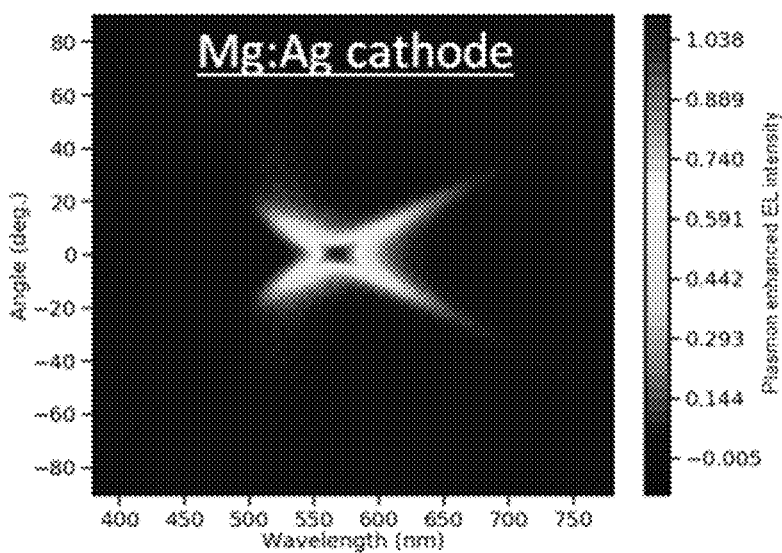
Figure 5E:
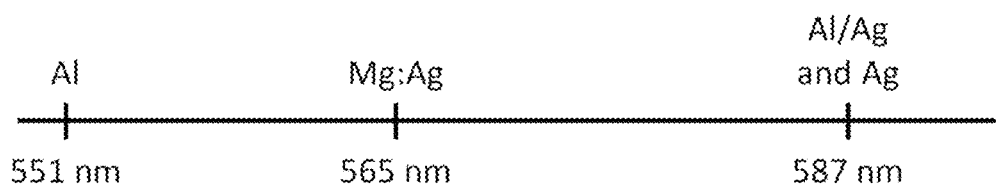
FIG. 5E summarizes the results shown in FIGS. 5A-5D by showing that the crossing wavelength of the dispersive mode is a function of the metal used for the cathode, with Ag and Al (1 nm)/Ag occurring iso-energetically the longest wavelength, Al occurring the shortest wavelength, and Mg:Ag occurring at an intermediate wavelength. These results are for use of the metals as cathodes 100 nm thick and adjacent organic material with refractive index ~1.7, using a corrugated OLED structure as shown in FIG. 3A.

Experimentally, it has been found that the energy of the dispersive mode that results from the OLED stack corrugation disclosed herein, which represents desired outcoupling of the SPR mode as light, is at least partially dependent on the type of metal that is used to harbor the SPR mode. This is shown in FIGS. 5A-5E. The crossing wavelength (identified by the center of the 'X' shape) of the dispersive mode depends on the index of refraction and the coefficient of extinction of the metal and adjacent dielectric materials. FIGS. 5A-5D show several intensity contour plots of the angle-dependent electroluminescent emission spectrum for corrugated OLED devices as disclosed herein, where the emissive layer is placed within a threshold distance of the cathode, but greater than a threshold distance from the anode as defined herein. The following cathode metals were investigated: Al (FIG. 5A), Al (1 nm)/Ag (FIG. 5B), Ag (FIG. 5C), and Mg:Ag 10% (FIG. 5D). These plots illustrate the difference between the P and S polarization intensities (i.e., P-S) and have had an additional background subtraction of a planar version of the identical OLED structure. It can be seen that the energy of the dispersive mode resulting from the Al cathode is about 0.14 eV higher than the energy of the dispersive mode resulting from Ag cathode. The energy difference represents an example tuning range for changing the plasmonically-active layer composition and for a fixed refractive index of the adjacent a material of ~1.7, which is typical for organics. That is, the range if energy for an plasmonically-active enhancement layer as disclosed herein may be adjusted at least in part by using different materials in the enhancement layer. In this example, the total tuning range achievable by changing the metal from Al to Ag with a fixed refractive index and using a fixed-pitch corrugation through the device as illustrated in FIGS. 3A-3C is 36 nm. This is summarized graphically in FIG. 5E, including the specific examples of FIG. 5A-5D.

As shown and described above, the thickness and composition of the enhancement layer(s) may be used to tune emission of a corrugated OLED as disclosed herein. Alternatively or in addition, the peak wavelength of the outcoupled SPR mode may be tuned by selecting a suitable adjacent layer refractive index. Because the energy of the dispersive mode associated with SPR-mode outcoupling shifts based on the effective refractive index of the neighboring environment of the enhancement layer, the emission of a device having the general structure as shown in FIG. 3B may be tuned by changing the composition of the underlayer. Similarly, the emission of devices having the general structure shown in FIG. 3C may be tuned by selecting different compositions of the underlayer and/or the overlayer.

Figure 6A:
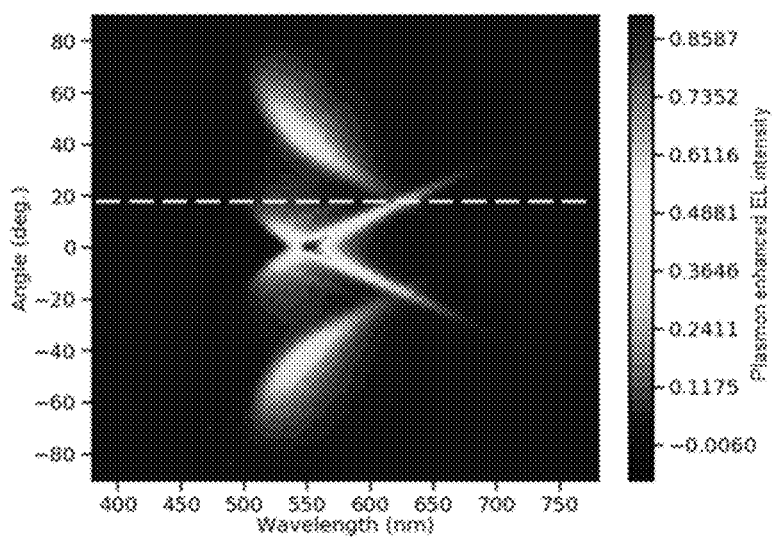
FIGS. 6A-6D show intensity contour plots of the angle dependent electroluminescent emission spectrum for a corrugated OLED stack with an underlayer with root mean square (RMS) roughness <1 nm (FIG. 6A) or an underlayer with RMS roughness ~1 nm (FIG. 6C) according to embodiments disclosed herein. Zero degrees represents normal incidence between the device and the detector.
Figure 6B:
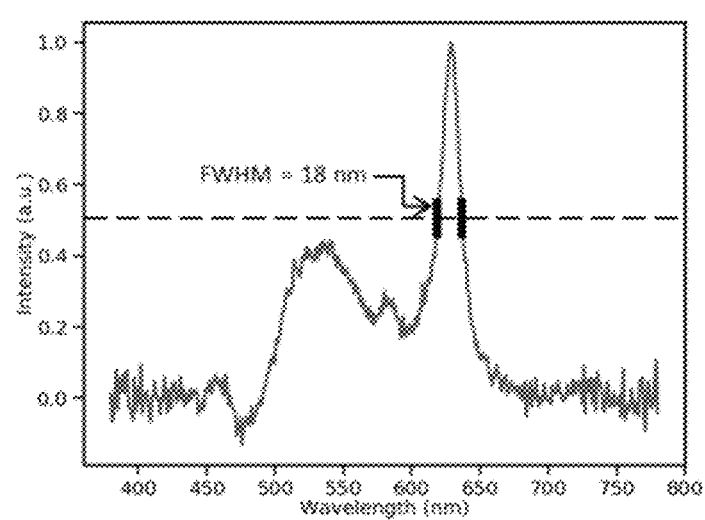
Figure 6C:
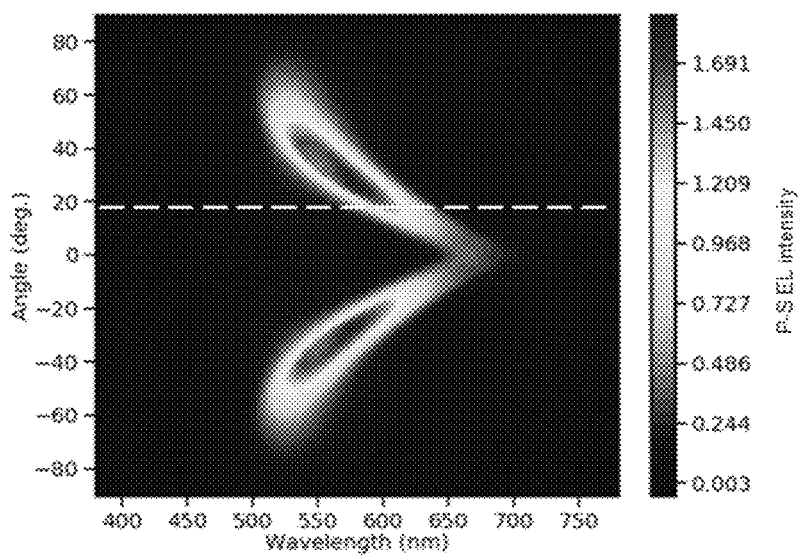
Figure 6D:
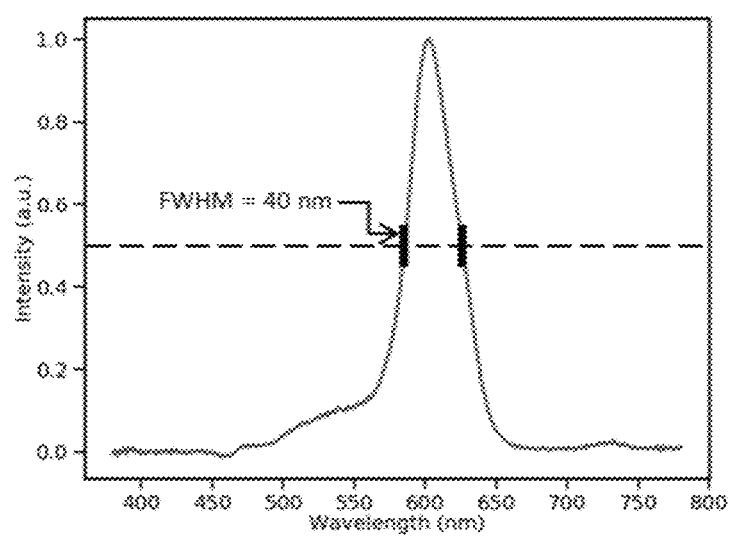

FIGS. 6A-6D show experimental results from two example devices that illustrate using the underlayer composition to tune the crossing point. The crossing wavelength at normal incidence of the dispersive mode occurs at much shorter wavelengths (i.e., higher energy) than it does in FIG. 6C. This is because the underlayer in FIG. 6A is a low index epoxy (n=1.56), whereas the underlayer in FIG. 6C is a high index molybdenum oxide (MoO3) film (n=2.06). This occurs for a fixed metal composition and grating pitch between the devices in FIGS. 6A and 6C, which in this case is Ag with a 1 nm Al adhesion layer for both the cathode and anode, each of which functions as an enhancement layer as disclosed herein. In this example, the total tuning range achievable by changing the underlayer refractive index from 1.56 to 2.06 with a fixed metal (here, Ag) and pitch is about 125 nm.

Based on these results, it has been found that the dispersive mode crossing wavelength can be tuned over a broad range by varying the metal type or the refractive index underlayer adjacent to the metal enhancement layer. Combining these two tuning methods yields a tunability range of approximately 150-200 nm for a fixed grating pitch.

To further demonstrate the tunability of a corrugated OLED device including one or more enhancement layers as disclosed herein, devices were fabricated using an Ag enhancement layer as the anode at varying thicknesses from 24 nm to 100 nm on three different refractive index underlayers: (1) n<1.7, (2) n~1.7, and (3) n>1.7. Because the organic materials deposited on top of the anode have a refractive index near 1.7, as more light is scattered from the 'backside' of the anode, the wavelength of the grating mode should change for indices (1) and (3). It has been found that, for an underlayer with a refractive index lower than the materials in the OLED stack (i.e., n<1.7), the energy of the dispersive mode, as determined by the crossing point wavelength of the mode at normal incidence, blue-shifts with increasing anode thickness. Conversely, for underlayers having a refractive index above the index of the materials in the OLED stack (i.e., n>1.7), the energy of the dispersive mode red-shifts with increasing anode thickness. If the underlayer is chosen to exactly match the refractive index of the organic materials, then no energy shift in the dispersive mode is observed, consistent the model and configurations disclosed herein.

Figure 6E:
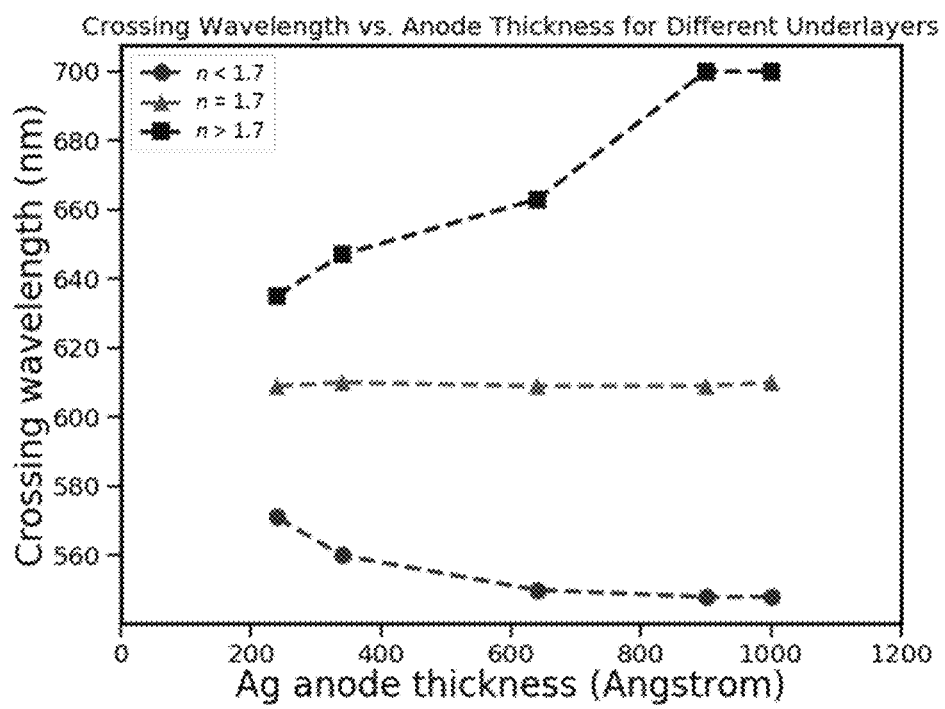
FIG. 6E shows a plot of the crossing wavelength of the dispersive mode as a function of the thickness of the anode metal for three underlayers with differing refractive index values according to embodiments disclosed herein.

Experimental results depicting this shift in crossing mode wavelength as a function of anode thickness for the three example devices described (incorporating three different underlayers where n<1.7, n=1.7, and n>1.7) are plotted in FIG. 6E. For Ag anodes thinner than 90 nm, the refractive indices both above and below the anode are averaged and the energy of the dispersive mode follows this "effective" refractive index. As the anode thickness increases, the contribution of the refractive index of the OLED stack to the effective refractive index diminishes until at some anode thickness the crossing mode no longer shifts for increasing anode thickness.

Figure 7A:
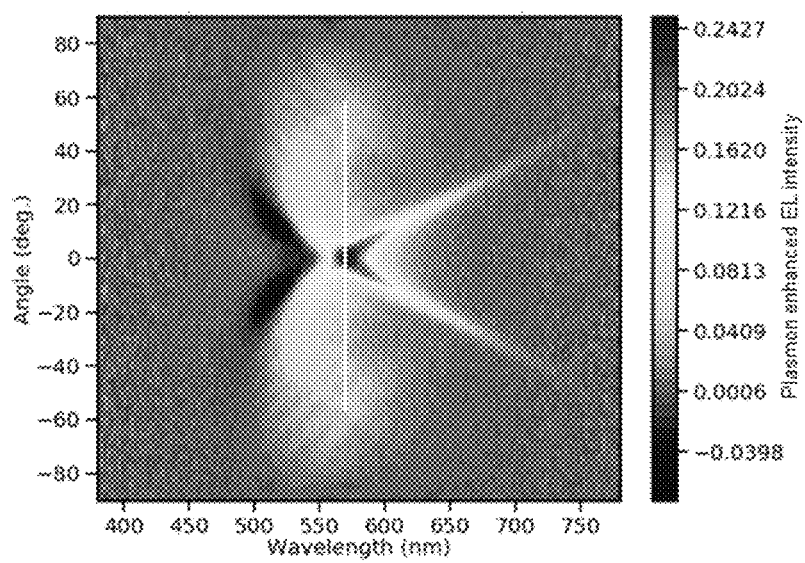
FIGS. 7A-7D show several intensity contour plots of the angle-dependent electroluminescent emission spectrum for corrugated OLED devices with an underlayer according to embodiments disclosed herein.
Figure 7B:
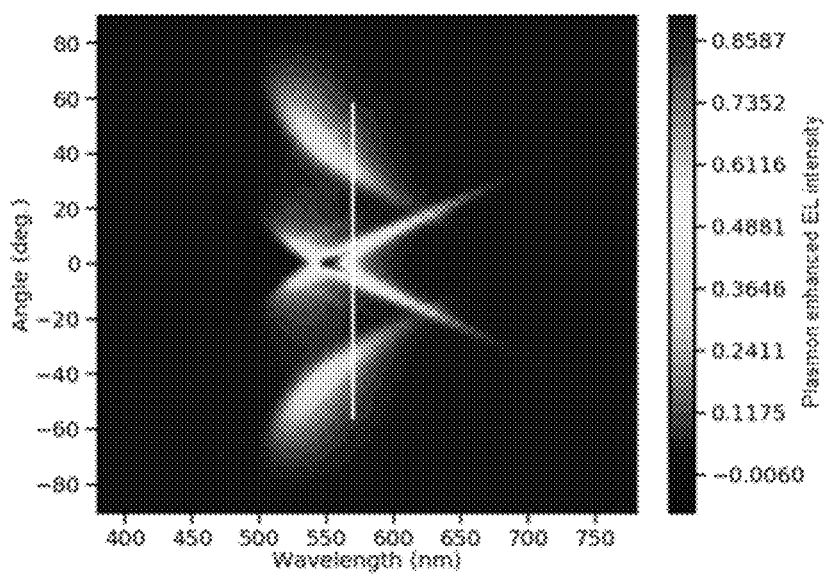
Figure 7C:
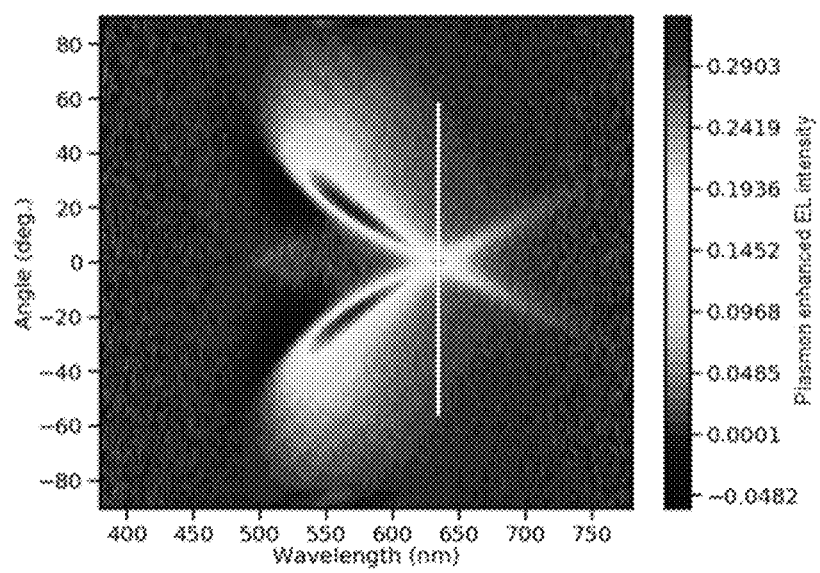
Figure 7D:
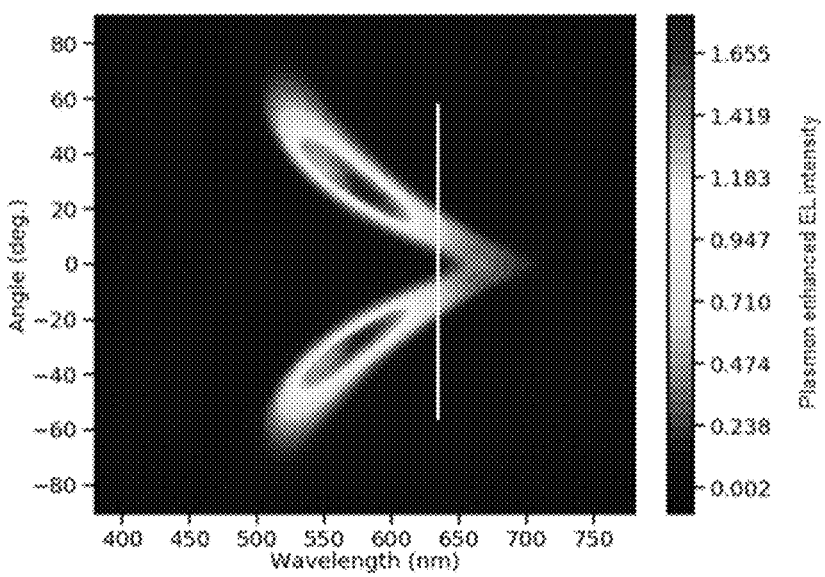

FIGS. 7A-7D show intensity contour plots of the angle-dependent electroluminescent emission of four example corrugated OLED devices as disclosed herein. FIGS. 7A and 7B show experimental results for an example device as previously described, which includes an epoxy underlayer (n<1.7) and either a 24 nm or 64 nm Ag anode, respectively. FIGS. 7C and 7D show corresponding results for an example device as disclosed herein, which includes a molybdenum oxide underlayer (n>1.7) and either a 24 nm or 64 nm Ag anode, respectively. The white vertical lines indicate the crossing wavelength of the dispersive mode at 24 nm Ag anode thickness. Consistent with the results shown in FIGS. 6A-6E, there is a blue shift in the crossing wavelength with increasing anode thickness for the epoxy underlayer device, and a red shift in the crossing wavelength with increasing anode thickness for the molybdenum oxide underlayer device.

Figure 8:
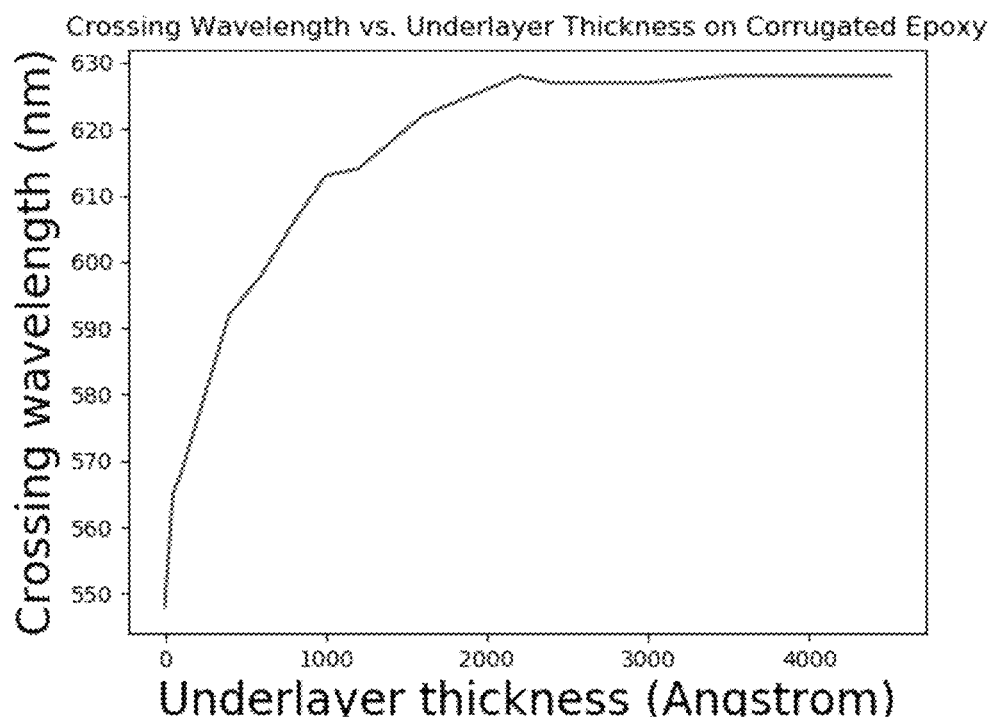
FIG. 8 shows the crossing wavelength of the dispersive mode as a function of underlayer thickness for an n=1.7 index underlayer and a 74 nm Ag anode with 1 nm Al adhesion layer according to embodiments disclosed herein.

Another technique to tune the light output of an OLED device as disclosed herein is to change the composition and/or thickness of one or more underlayers as previously disclosed with respect to FIG. 3. To demonstrate the color tuning properties of the underlayer, devices were fabricated using an Ag anode thickness of 74 nm with 1 nm Al adhesion layer, with a stacked underlayer composed of 2 materials. It is believed that the thickness of the underlayer adjacent to the anode ("underlayer 1") is of particular significance. The first underlayer is formed of corrugated epoxy as previously disclosed. The thickness of the second underlayer ("underlayer 2"), which is disposed beneath underlayer 1, is quasi-infinite Varying the thickness of underlayer 1 from 0 to 450 nm reveals that the influence of underlayer 2 on the crossing wavelength can be dampened, and ultimately screened out completely. This can be seen in FIG. 8, which shows the crossing wavelength as a function of the underlayer thickness. The crossing wavelength of the dispersive mode starts to saturate as a function of underlayer 1 thickness at approximately λ/n, where λ is the wavelength of light and n is the refractive index of the underlayer, indicating that the whole photon feels the effect of the underlayer index as it leaves the grating. In some embodiments, an underlayer as disclosed herein may have a thickness not more than 4nλ, where λ is a peak wavelength of light emitted by an emissive layer in the OLED device and n is a refractive index of the underlayer. As a specific example, the underlayer may be not more than 1000, 800, 600, or 550 nm thick.

Figure 9:
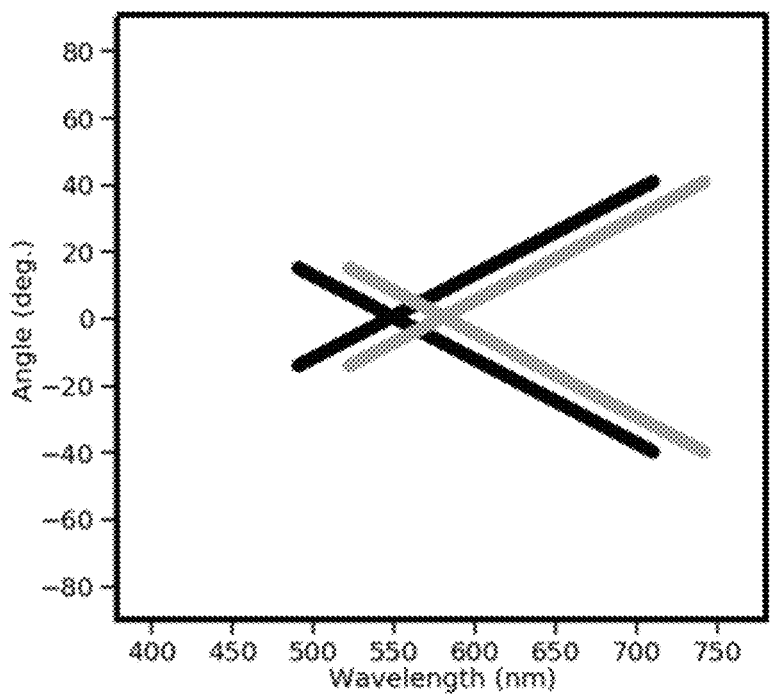
FIG. 9 shows a schematic drawing of the angle dependent electroluminescent emission spectrum of a device that achieves outcoupling from two distinct dispersive modes resulting from independent SPR modes on both the cathode and anode according to embodiments disclosed herein.

In another aspect of the present disclosure, techniques are provided to control the combination of emission and angle of light emitted by a corrugated OLED device as disclosed herein. This control may be achieved by selecting the metal composition of the enhancement layer in conjunction with the refractive index of the adjacent layer, such as an underlayer as previously disclosed, to tune the emission from light coupled to the surface plasmon mode for a corrugated metal. For example, by utilizing a device where the index of refraction and extinction coefficient (n, k) of the enhancement layer and an adjacent dielectric material layer are dissimilar for the cathode and anode enhancement layers, two distinct dispersive modes resulting from independent SPR modes on both the cathode and anode may be achieved. A schematic angle and wavelength resolved spectrum of such a device is shown in FIG. 9. By harnessing the outcoupling efficiency of two corrugated, plasmonically actively materials the total outcoupling efficiency of the SPR mode(s) may be increased. Further, such a configuration may provide additional control methods for tuning the emission spectrum.

Figure 10:
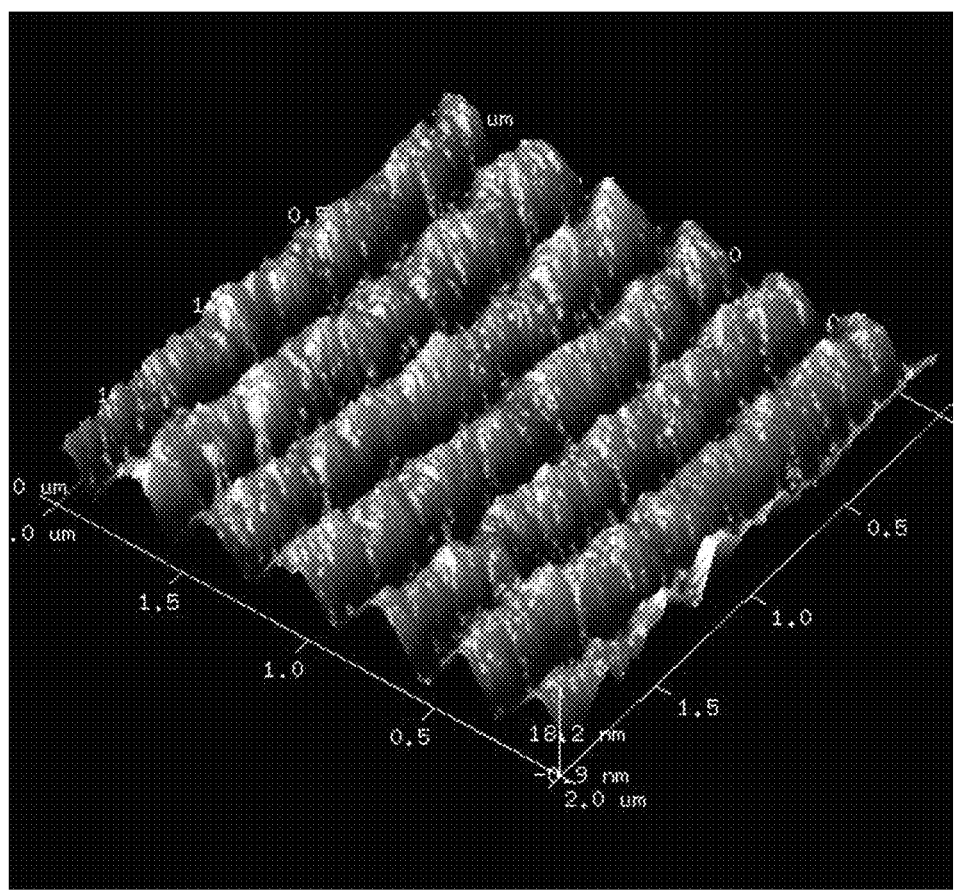
FIG. 10 is an atomic force microscope image of the top of a completed corrugated OLED device as disclosed herein, showing that corrugation and pitch are maintained all the way through the cathode.

Another technique to tune the light output of a corrugated OLED device that includes one or more enhancement layers as disclosed herein is available via the roughness of the corrugation. Specifically, the spectrum and outcoupling efficiency of the device may be controlled by modulating the roughness of a corrugated plasmonically-active enhancement layer. For example, a device structure as shown in FIG. 3B may be used, in which the corrugation from the corrugated epoxy propagates through the whole device, an experimental example of which is shown in FIG. 10.

Figure 11A:
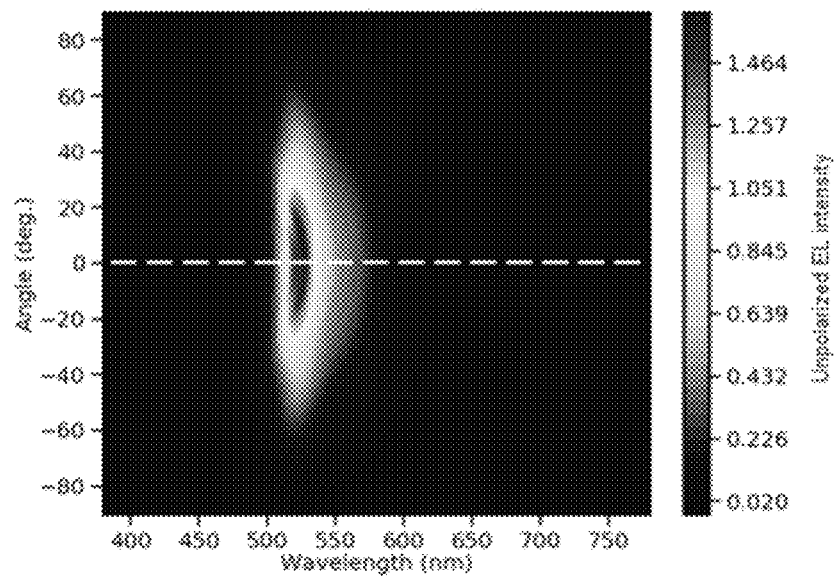
FIG. 11A shows an intensity contour plot of the angle-dependent electroluminescent emission spectrum for the green sub-pixel in a conventional commercial OLED panel.
Figure 11B:
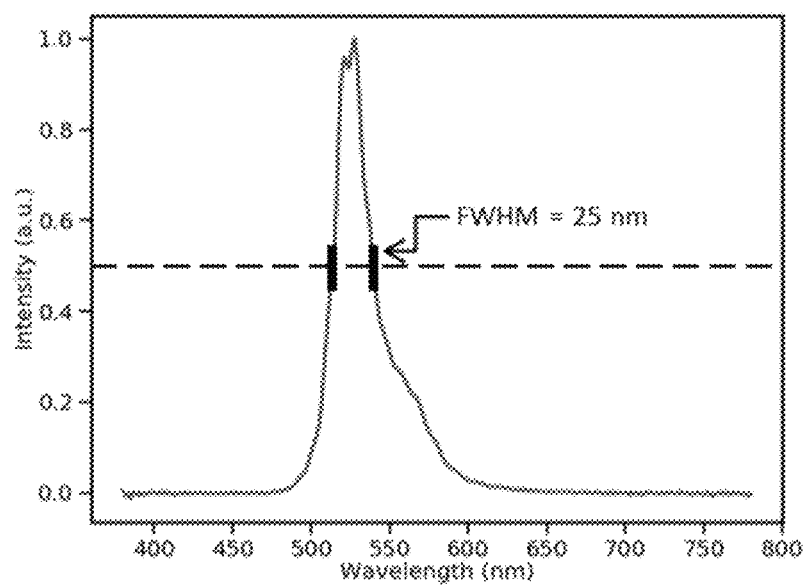
FIG. 11B is a plot of intensity vs. wavelength at normal incidence of the device (identified by the white dashed line in FIG. 11A), showing a FWHM emission peak broadness of ~25 nm.

Further, in some configurations, any roughness in an underlayer may transfer to the layer or layers subsequently deposited over the underlayer. When the rough underlayer is in direct contact with an enhancement layer such as a plasmonically active anode, a "roughness-enhanced-outcoupling grating pattern" may be created that is able to access a wider spectral range for outcoupling the SPR mode. This effect is apparent in the data shown in FIGS. 6A-6D. For example, FIG. 6A shows an intensity contour plot of the angle-dependent electroluminescent emission spectrum for an example corrugated OLED device with an epoxy underlayer with an index of refraction of 1.56. The epoxy has an RMS roughness less than 1 nm when spin cast on a silicon wafer. In this example device, the FWHM of one "arm" of the dispersive mode at a fixed angle (18 degrees off normal, identified by a white dashed line in FIG. 6A) is 18 nm (shown in FIG. 6B). In another example device, $MoO_3$ is used as an underlayer, which has a RMS roughness of approximately 1 nm when deposited on a silicon substrate. In this example device, the FWHM of one arm of the dispersive mode at a fixed angle (18 degrees off normal, identified by a white dashed line in FIG. 6C) is 40 nm (shown in FIG. 6D). Zero degrees represents normal incidence between the device and the detector. FIG. 6A is a plot of the difference between the P and S polarizations (i.e., P-S), with the P-S plot of an identical-in-structure but non-corrugated (i.e., planar) control device subtracted. FIG. 6C is a similar P-S plot, without the planar control subtracted. From these results it can be seen that controlling the RMS roughness of the underlayer allows devices to span the range of emission peak widths in commercial OLED phones, which typically have a FWHM of ~25 nm for an individual color pixel. An example of the angle and unpolarized intensity as a function of wavelength for an example comparative device is shown in FIG. 11A. FIG. 11B shows the intensity of the same device as a function of wavelength.

The increase in spectral width of the grating-outcoupled surface plasmon mode is due to the fact that the energy of the dispersive mode for plasmon outcoupling is determined in part by the grating pitch (Γ) and the difference in refractive index values (Δn) between the metal enhancement layer and the adjacent dielectric material. Increasing the RMS roughness adds local perturbations to these values, which will result in ensemble averaging and a change in the spectral width of the dispersive mode. It is believed that the total outcoupling efficiency depends on the spectral overlap between the emission spectrum of the emissive material and the grating outcoupling. By tuning the full-width half-maximum (FWHM) of the dispersive mode with increasing RMS roughness, the efficiency and spectrum of the corrugated OLED may be controlled. To achieve the maximum outcoupling efficiency, it may be preferable to have an underlayer with RMS roughness greater than 1 nm, preferably greater than 2 nm, or preferably 3 nm or more in some embodiments. However, in some embodiments the RMS roughness should not exceed 50 nm, because it is possible that device shorting will become an issue. This may be more likely in plasmonic OLED devices as disclosed herein because they often are made relatively thin in order to place the emitting dipoles within a threshold distance of the plasmonically active enhancement layer anode and/or cathode as previously disclosed.

To reduce the likelihood of shorting a corrugated OLED device as disclosed herein, various design parameters and deposition techniques may be used. For example, the corrugation profile of the corrugated outcoupling layer or similar structure may not have sharp edges so as to ensure that the subsequently deposited layers are conformally coated. Such a structure may be achieved by using a smooth corrugation profile, such as a sinusoidal profile, or by taking a sharp-edged corrugated profile and imprinting it into epoxy to duplicate the features while rounding out the sharp edges, through such methods as nanoimprint lithography. Accordingly, although the example illustrations provided herein may show sharp-edged corrugation profiles for ease of illustration and understanding, it will be understood that in some configurations a different profile may be used. As another example, non-directional deposition methods such as chemical vapor deposition, atomic layer deposition, and the like may be used to achieve conformal coating of layers deposited over the corrugated outcoupling layer. Methods such as vacuum thermal evaporation also may benefit from substrate rotation to improve thin film continuity over the corrugated surface. In some situations, deposition at oblique angles, or by varying the angle of the substrate during deposition, may help improve thin film uniformity. As another example, when metal layers such as Ag, which tends to grow via islanding and result in rough films, are used, the use of a thin adhesion layer (for example, about 0.1-10 nm)

as previously disclosed, may help improve the smoothness of the metal film. Such an adhesion layer may include Al, Au, Mg, Ni, Ge, or any other suitable material.

In another aspect of the present disclosure, three-dimensional (3D) gratings that take advantage of a complex refractive index landscape may be used to further increase outcoupling. An added benefit of such a configuration is that a 3D grating may reduce angular dependence that otherwise may be common with corrugated OLED devices. Whereas a 1D corrugated OLED device with a fixed grating pitch (such as shown and described with respect to FIG. 3) has only a single diffraction condition for plasmon outcoupling, a 3D grating allows for more diffraction modes, thereby reducing the angular emission dependence.

Figure 12:
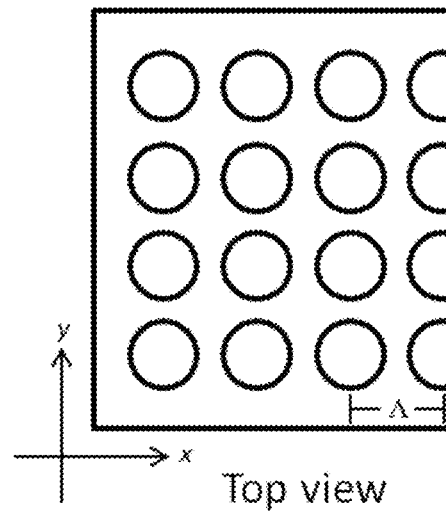
FIGS. 12A and 12B show top and side views, respectively, of a 3D grating of cones on a substrate that may be used to enhance outcoupling of the surface plasmon mode according to embodiments disclosed herein. The pitch in the x (Λ) and y (T) directions may or may not be the same (FIG. 12A) and the cones (n2) have a different index of refraction than the surrounding medium (n1).
FIG. 12C shows a plot of the effective refractive index for the different cross sections (i, ii, and iii) depicted by the dashed lines in FIG. 12B.
Figure 12B:
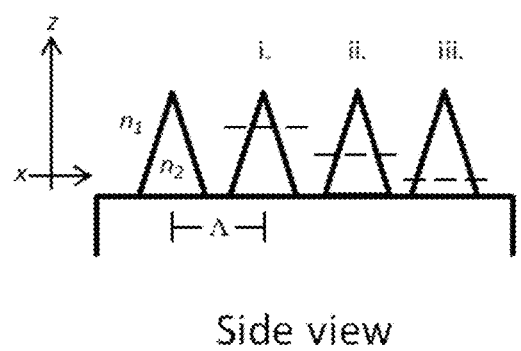
Figure 12C:
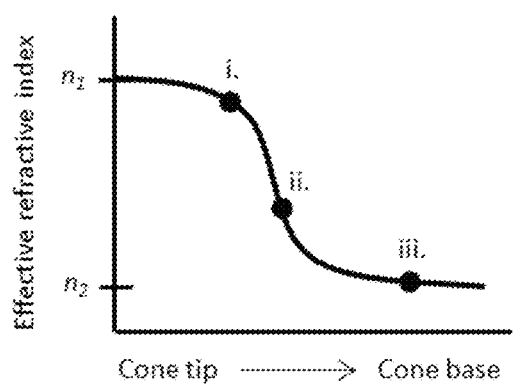

FIG. 12A shows an example of such a 3D grating with a periodic lattice of cones that may or may not have the same pitch in both x and y directions (i.e., pitch values of $\Lambda$ and $T$ in FIG. 12A), or may have, for example, hexagonal periodicity as opposed to the rectangular periodicity shown in FIG. 12A. This structure results in an effective refractive index that changes from the bottom of the cone to the tip as different conic sections are considered, i.e., mostly n1, mostly n2, or somewhere in between. FIG. 12B shows example points i, ii, iii in the z direction that have different proportions of material and therefore different effective refractive indices. An example of the effective refractive index at each point is depicted graphically in FIG. 12C. The varying effective refractive index will, in turn, tune the energy of the dispersive mode to a different resonant value at various points along the cone's surface. Such a configuration may provide the ability to access a much wider spectral range for SPR mode outcoupling and may also reduce angular-dependent emission.

In another aspect of the present disclosure, an OLED structure is provided that incorporates an SPR outcoupling mechanism as previously disclosed, which minimizes light emission that is not coupled to the enhancement layer. Because the emission resulting from excitons close enough to couple to the enhancement layer will age more slowly than emission from excitons far from the enhancement layer, eliminating light from excitons which are too far away to couple to the enhancement layer will result in consistent emission intensity over time and increased device operational lifetime. This will ensure pixel color accuracy over the product's lifecycle.

To achieve a device in which light is only outcoupled from the backside of the anode, a device configuration is used in which the EML is within a threshold distance of the anode but beyond the threshold distance to the cathode, which means that the anode will provide the only enhancement layer that harbors the SPR mode. In this context, "backside" coupling refers to coupling of the SPR mode from the side of the metal electrode or other enhancement layer adjacent the OLED stack to the opposite side of the metal enhancement layer (i.e., the "backside" of the metal). To achieve a device in which light is only outcoupled from the backside of the anode, it is useful to consider the relationship between the mode coupling from the front side to the backside versus the transmittance of the layer as a function of thickness.

To do so, a device configuration as shown in FIG. 3B may be used. This device includes a corrugated epoxy layer which transfers the corrugation through the entire layer stack as previously disclosed. This allows the enhancement layer to be corrugated and to directly scatter light. The specific device configuration used is illustrative, and it is expected that conclusions from such a device also will hold for devices where the outcoupling layer is a distinct layer. An example device includes a glass substrate; a plasmon outcoupling layer of corrugated epoxy with 320 nm pitch; a 100 nm underlayer of a particular refractive index (e.g., as shown in FIG. 3B); an anode including a silver (Ag) thin film and a 1 nm aluminum (Al) adhesion layer; an organic stack including a hole injection layer (5 nm), a hole transport layer (5 nm), an electron blocking layer (5 nm), an emissive layer (EML) 10 nm thick consisting of a host doped with an emitter at 12% concentration, an electron transport layer (59 nm), and an electron injection layer (1 nm); and a cathode including a 1 nm Al adhesion layer and 100 nm of Ag. In this example device, the EML is within a threshold distance of the anode and the anode is corrugated, so light from the SPR mode can be scattered from the anode directly. Furthermore, placing the EML within a threshold distance of both a metal anode and metal cathode (enhancement layers) will speed up the excited state transient lifetime even further than placing the EML within a threshold distance of only one metal contact.

As seen in FIGS. 7A-7D, the energy shift of the dispersive mode as a function of anode thickness in the direction expected for the index of refraction beneath the anode indicates that the SPR mode is able to couple from the side of the anode enhancement layer adjacent the OLED stack to the opposite side of the anode (i.e., the 'backside' of the anode). For an opaque Ag anode and an opaque cathode, the predominant emission coming from the device will occur from scattering of SPR modes that have coupled to the backside of the anode. A similar effect can occur on the cathode side of the device enabling top emission devices (such as shown in FIG. 3C). For example, for a top emission device with an opaque anode and opaque Ag cathode, where the EML is within a threshold distance of the cathode (as an enhancement layer), the predominant emission coming from the device is from scattering of SPR modes that have coupled to the backside (i.e., topside) of the cathode. This results in a "SPR-emission-only" device.

In addition to be a method for tuning the color of the emission, the method of increasing anode thickness and tracking the resulting effects on SPR mode emission can be used to identify a thickness of the enhancement layer at which light only results from SPR outcoupling from the backside of the enhancement layer. This critical value may depend on the metal used in the enhancement layer, and certain metals may not be suitable for this application if the thickness at which the metal becomes opaque is greater than the maximum distance over which the plasmon mode can couple from the front side to the backside of the metal.

Figure 13:
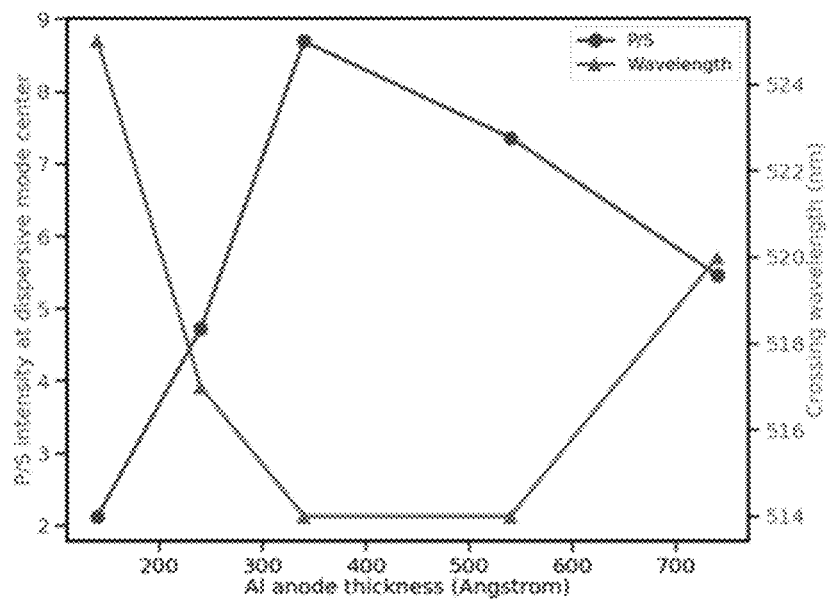
FIGS. 13 and 14 show plots of the intensity of P- to S-polarizations at the dispersive mode center (i.e., crossing wavelength), and the dispersive mode crossing wavelength both as a function of anode thickness for an Al anode (FIG. 13), and an Ag anode with 1 nm Al adhesion layer (FIG. 14) according to embodiments disclosed herein.

This phenomenon may be understood by considering the ratio of the P-polarized emission intensity (which can support the plasmon mode) to the S-polarized emission intensity (which cannot support the plasmon mode), at the angle and wavelength combination of the crossing point (center) of the dispersive mode. It is expected that the ratio of P/S intensity initially rises with increasing anode thickness because a thicker metal layer better supports the plasmon mode in P. But as the metal continues to thicken, the emission becomes increasingly dominated by scattering of the plasmon on the backside of the metal, which requires a strong coupling from the front side to the backside of the metal. This coupling decreases with increasing anode thickness, while the metal opacity simultaneously increases. If the backside coupling decreases at a faster rate than the opacity increases, we expect to see a peak in the P/S ratio and then ultimately a decrease to the P/S ratio value when no plasmon outcoupling method is present as the metal thickness goes to infinity. This is the case for an aluminum anode, as shown in FIG. 13.

Figure 14:
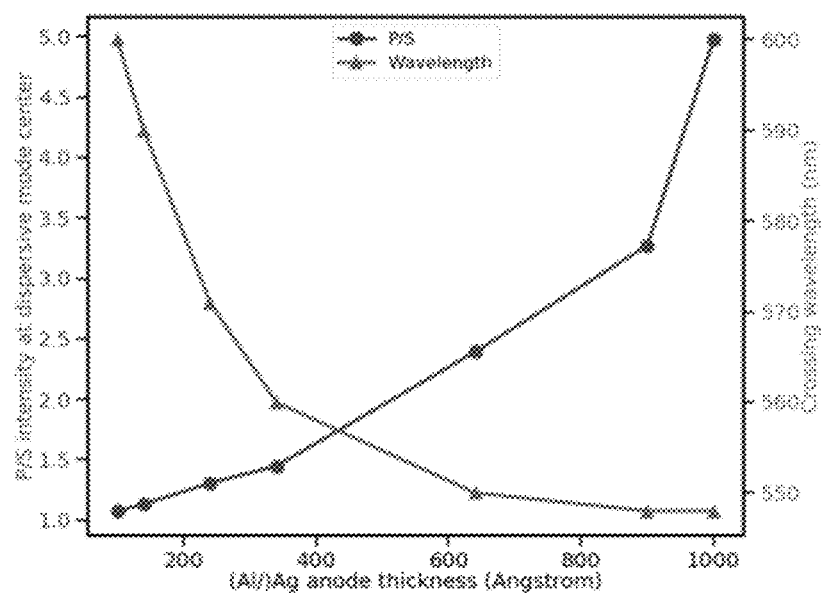

If, however, the backside coupling decreases at a slower rate than the opacity increases, then at some point only plasmon (P-polarized) emission from the backside of the metal occurs while the non-plasmon (S-polarized) emission goes to zero for an opaque metal. In this case, the ratio of P/S should diverge to infinity with increasing metal thickness and, indeed, this is the case for a silver anode (FIG. 14). FIGS. 13 and 14 also show the crossing wavelength of the dispersive mode as a function of the anode thickness for aluminum and silver, respectively. For aluminum, a blue-shift with increasing anode thickness is initially observed, which is expected for these example devices that utilize low index (n<1.7) underlayers. However, at a 34 nm anode thickness where the P/S ratio peaks, the crossing wavelength saturates and then ultimately begins to red-shift for Al anodes thicker than 54 nm. This indicates that, for Al anodes, the backside coupling efficiency drops off faster than the opacity increases, and thus the effective refractive index rises. In the case of an Ag anode with 1 nm Al adhesion layer (as shown in FIG. 14), the crossing wavelength blue-shifts with increasing anode thickness as a result of efficient coupling of the SPR mode to the backside of the anode and only saturates for Ag anodes thicker than 90 nm, which is when the emission is predominantly from SPR outcoupling from the backside of the anode.

As used herein, an "enhancement layer" refers to a layer that includes a plasmonic material that exhibits surface plasmon resonance that non-radiatively couples to an organic emissive material and transfers excited state energy from the emissive material to a non-radiative mode of surface plasmon polaritons of the enhancement layer. As previously disclosed, it may be preferred for the enhancement layer to transfer the majority of excited state energy to the non-radiative mode(s) in embodiments disclosed herein. An electrode in an OLED device as disclosed herein may function as an enhancement layer, or an enhancement layer may include an electrode, or one or more layers that function as an electrode. The enhancement layer also may include other layers, such as an adhesion layer.

The enhancement layer may have a thickness selected based upon the desired properties of the device, including one or more dimensions needed to achieve the desired threshold distance(s) between the emissive layer and the enhancement layer as previously disclosed. As a specific example, an enhancement layer as disclosed herein may have a thickness of 20-100 nm.

The enhancement layer may be composed of one or more plasmonic materials, optically active metamaterials, or hyperbolic metamaterials. An enhancement layer and/or an electrode used in a device as disclosed herein may include one or more materials such as Au, Ag, Mg, Al, Ir, Pt, Ni, Cu, W, Ta, Fe, Cr, Ga, Rh, Ti, Cr, Ru, Pd, In, Bi, small organic molecules, polymers, $SiO_2$, $TiO_2$, $Al_2O_3$, insulating nitrides, Si, Ge, insulating fluorides, ZnS, ZnSe, $MgF_2$, LiF, $MoO_3$, and transparent conducting oxides, and may include alloys and/or mixtures of metals.

The difference between a neat metal and a metal used as an enhancement layer depends on whether the metal is located within a threshold distance of the emitting dipole; if it is located within the threshold distance, the metal is an enhancement layer as disclosed herein. A metal or other enhancement layer materials disclosed herein may be used as an anode, cathode or combination of the two.

As used herein, a "plasmonic material" refers to a material in which the real part of the dielectric constant crosses zero in the visible or ultraviolet region of the electromagnetic spectrum.

In general, a metamaterial is media composed of different materials where the media as a whole acts differently than the sum of its material parts. As used herein, an "optically active metamaterial" is one that has both negative permittivity and negative permeability.

In some embodiments, an enhancement layer as disclosed herein may include multiple vertically stacked unit cells or layers. The layers may be the same or different in material composition. In general an enhancement layer as disclosed herein will be composed of at least 50% of a unit cell, although there is no upper limit on the number of unit cells in an enhancement layer. In some embodiments, it may be preferred for an enhancement layer to include 0.5 to 10 units cells, more preferably 0.5 to 5 unit cells. This configuration differs from a conventional Distributed Bragg Reflector in the fact that more unit cells in the enhancement layer does not necessarily represent greater performance.

A unit cell may have subcomponents. In an embodiment, a unit cell may include one metallic layer and one dielectric layer subcomponent. Each subcomponent layer can itself be composed of multiple layers of materials. Typical metallic layer materials include: Ag, Au, Pt, Al, Cu, Ni, Ti, and conducting oxides and nitrides. The metallic layer may have an imaginary component of the refractive index greater than 1 over for some part of the wavelength spectrum from 400-750 nm. Metallic layers may be deposited by a number of processing techniques including electron beam evaporation, thermal evaporation, atomic layer deposition, sputtering, and various chemical vapor deposition techniques. The dielectric layer can include small organic molecules, polymers, wide bandgap oxides ($SiO_2$, $TiO_2$, $Al_2O_3$, etc.), insulating nitrides, and undoped semiconductors (Si and Ge for example). The real part of the refractive index of these materials can span 1.3 to 4.1. The imaginary component may be less than 1 over the wavelength range of 400 to 750 nm. The dielectric layers may be deposited by thermal evaporation, ink jet printing, organic vapor jet printing, spin coating, doctor blading, the Langmuir-Blodgett technique, pulsed laser deposition, sputtering, and various chemical vapor deposition methods including atomic layer deposition. Optically active metamaterials can also be made by patterned grooves in solid metallic films. The films would be deposited by any of the methods cited above.

As used herein, a "hyperbolic metamaterial" refers to anisotropic media in which the permittivity or permeability are of different sign for different spatial directions. Optically active metamaterials and hyperbolic metamaterials may be distinguished from many other photonic structures such as Distributed Bragg Reflectors in that the medium appears uniform in the direction of propagation on the length scale of the wavelength of light. That is, the dielectric constant of the metamaterials in the direction of propagation can be described with the effective medium approximation.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

EXPERIMENTAL METHODS

Figure 15A:
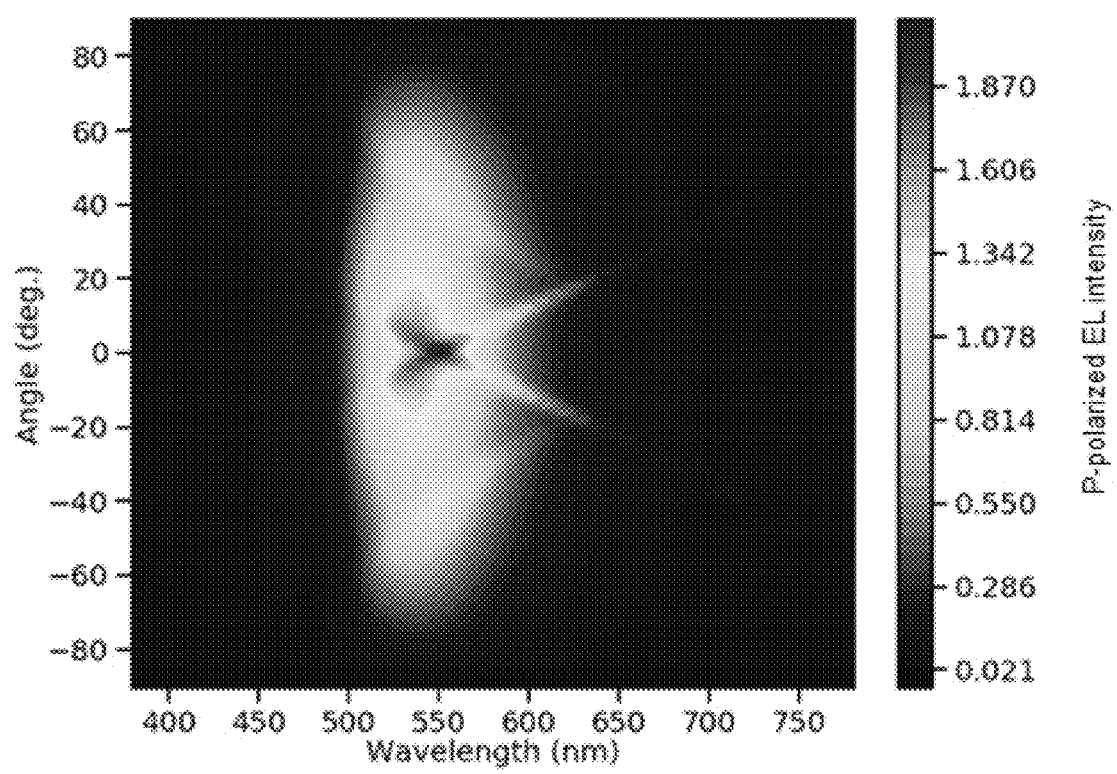
FIGS. 15A-15C show intensity contour plots of the angle dependent electroluminescent emission spectrum for the same corrugated OLED as in FIG. 6A, with P-polarization (FIG. 15A), S-polarization (FIG. 15B), and the difference between the two, P-S (FIG. 15C) according to embodiments disclosed herein. P and S polarizations are normalized to 516 nm and normal incidence before subtraction is performed. Since the plasmon mode can only exist in the P-polarization, whereas other grating modes can exist in both S- and P-polarizations, the difference, P-S, accentuates light scattered from the plasmon mode.
Figure 15B:
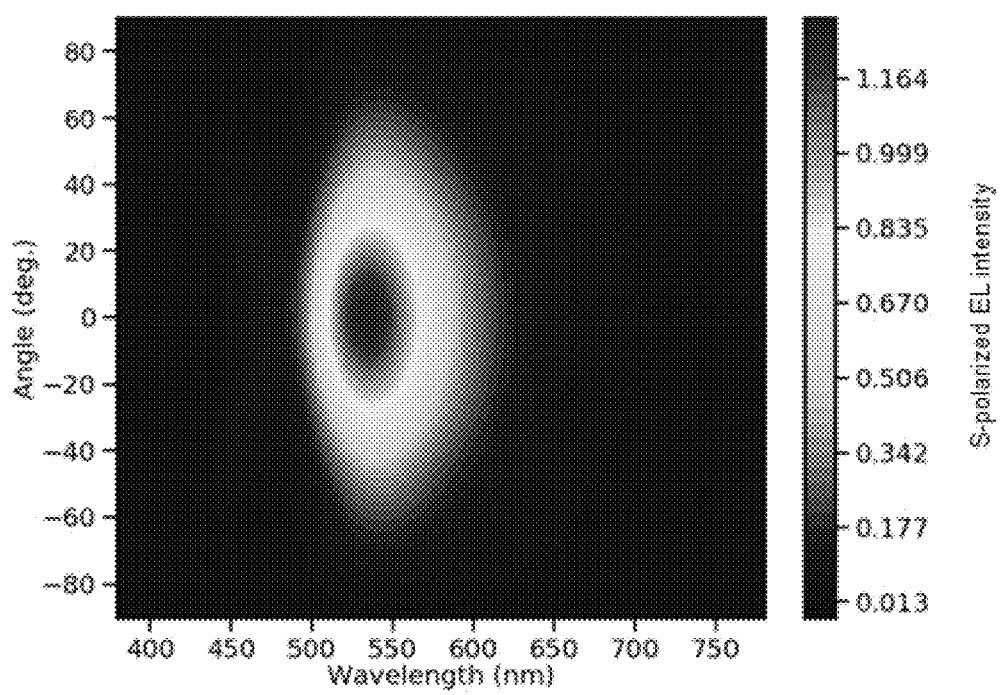
Figure 15C:
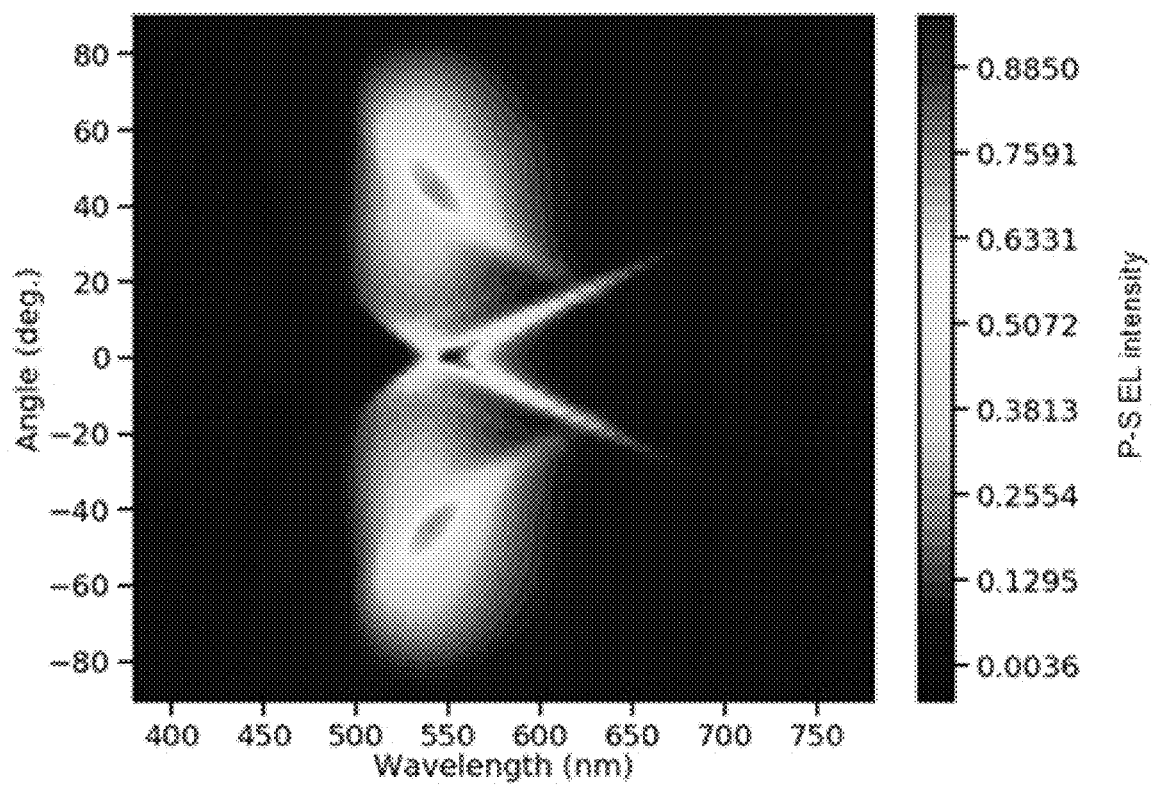
Figure 16A:
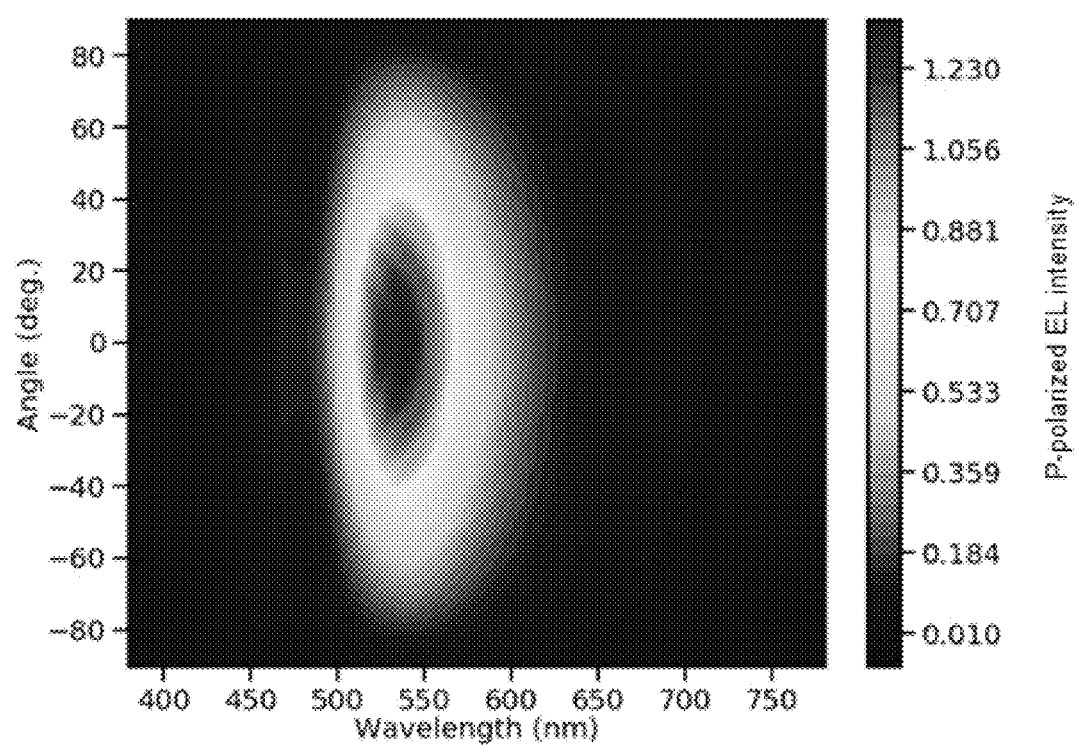
FIGS. 16A-16C show intensity contour plots of the angle-dependent electroluminescent emission spectrum for a non-corrugated (i.e., planar) OLED with the same structure as in FIG. 6A, with P-polarization (FIG. 16A), S-polarization (FIG. 16B), and the difference between the two, P-S (FIG. 16C) according to embodiments disclosed herein. P and S polarizations are normalized to 516 nm and normal incidence before subtraction is performed.
Figure 16B:
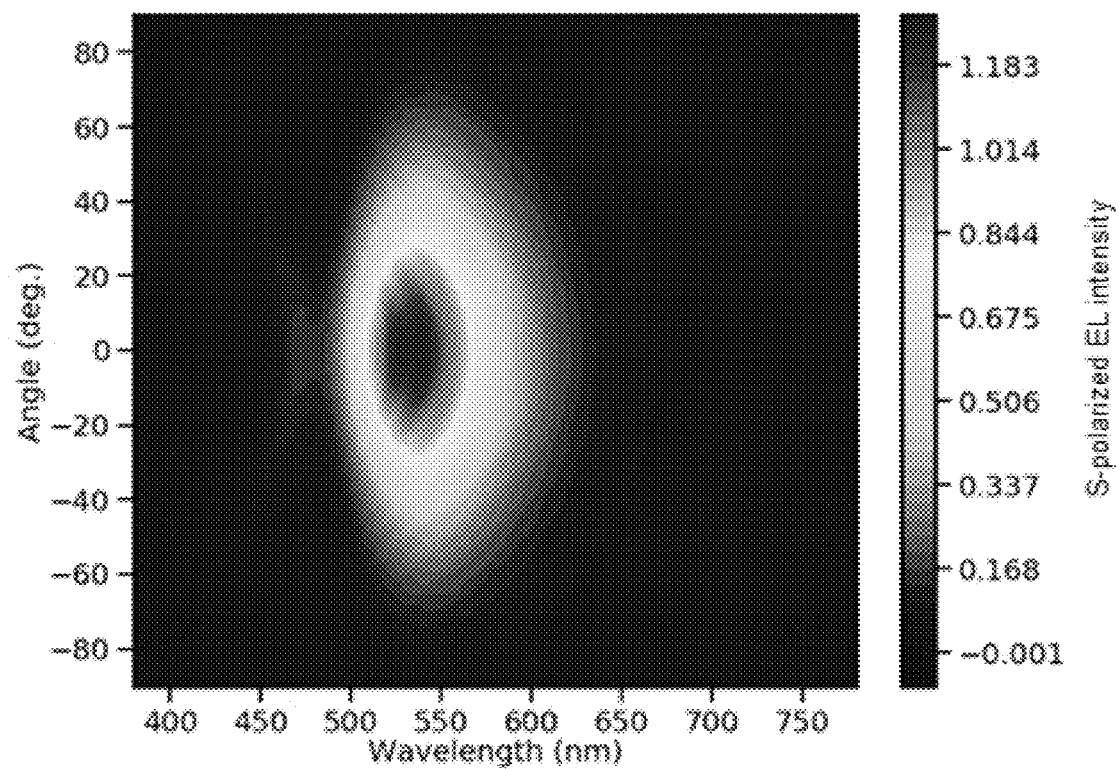
Figure 16C:
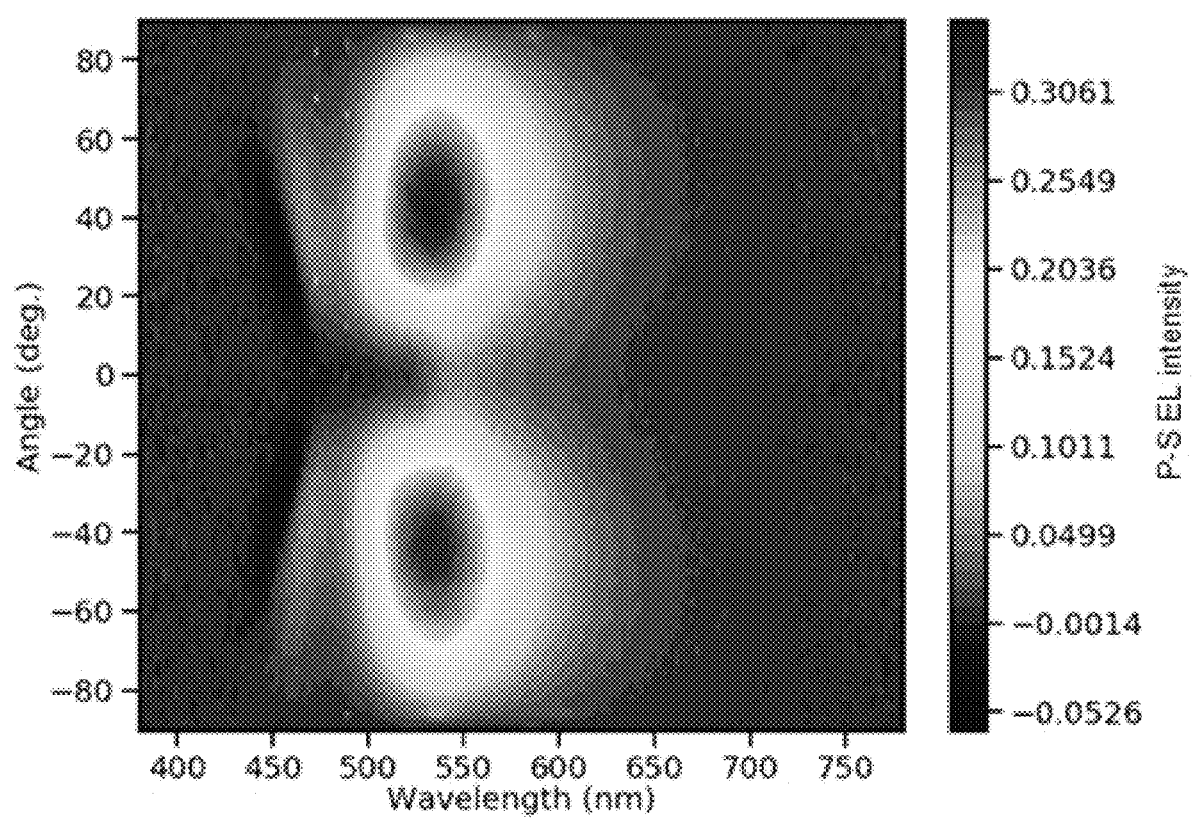
Figure 17A:
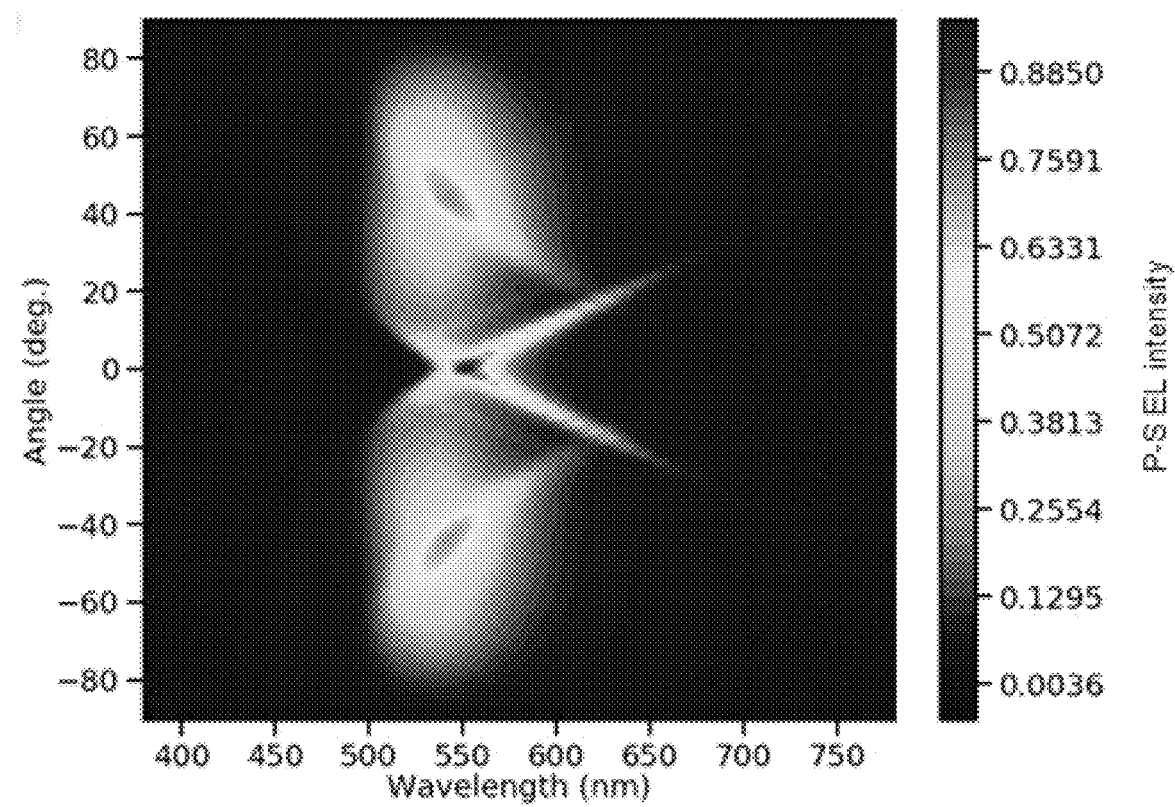
FIGS. 17A-17C show how the "lobes" left behind by the P-S subtraction of the planar device (FIG. 17B) can be subtracted from the P-S plot of the corrugated device (FIG. 17A) to yield an intensity contour plot as shown in FIG. 17C, which is identical to FIG. 6A according to embodiments disclosed herein. Since these lobes are essentially a measurement artifact, subtracting them from the corrugated contour plot gives the cleanest picture of the plasmon mode.
Figure 17B:
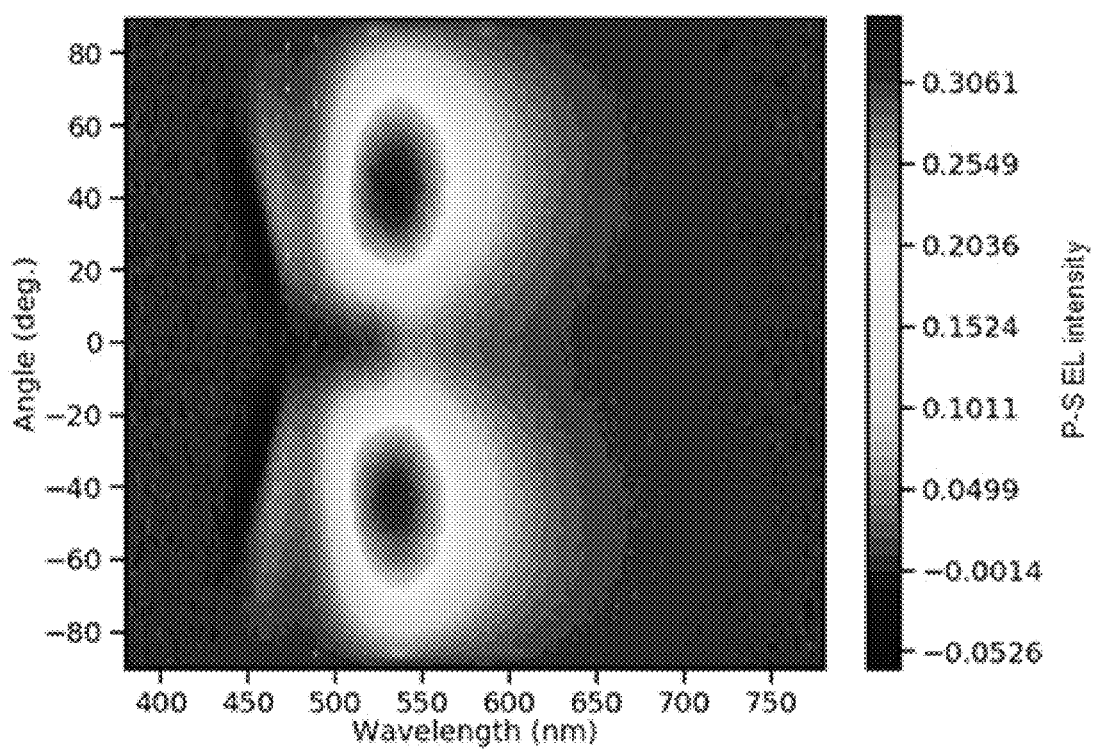
Figure 17C:
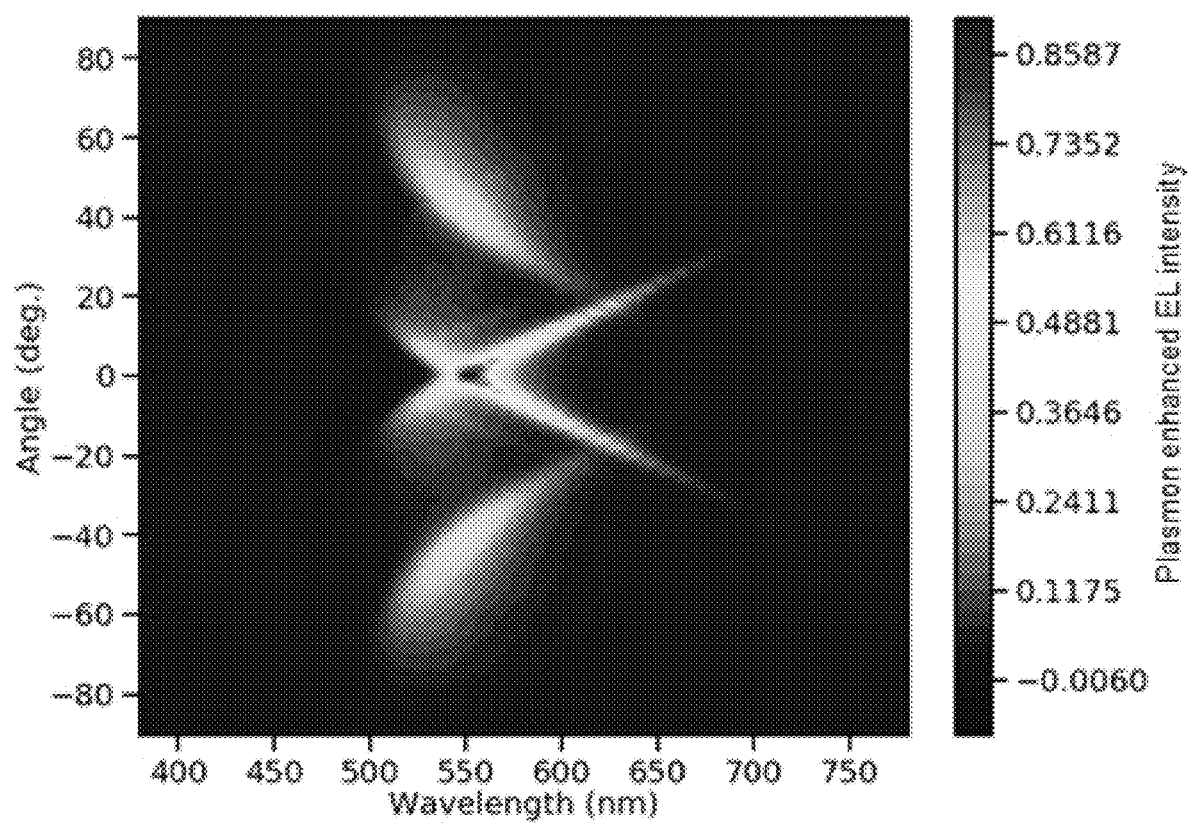

The intensity contour plots of the angle-dependent electroluminescent emission provided herein display an enhanced plasmon signal by utilizing a data processing technique that is graphically illustrated in FIGS. 15, 16, and 17.

Light that is coupled out from the surface plasmon mode of a thin film of metal can only be P-polarized. However, light which is scattered by the corrugated grating can be both S and P polarized. By taking the difference of P-polarized EL (a) and the S-polarized EL (b), the plasmon mode is accentuated. The corresponding P-S EL intensity (i.e., the difference between the P and S intensities) is shown in plot (c). Before performing the subtraction, the P and S polarizations are normalized to 516 nm and normal incidence. This wavelength-angle combination was chosen since it represents intrinsic emission that is not coupled to the grating modes and thus ideally the background intrinsic emission is suppressed by performing this normalization.

This method leaves behind two emission "lobes" at angles approximately 50 degrees off normal incidence. This is likely due to the Brewster angle and dipole orientation that lead to S- and P-polarized light subtraction differences and should be present in an identically-structured non-corrugated (i.e., planar) OLED device. To confirm this, the same P-S subtraction technique is performed on such a planar device in FIG. 16. It can be seen the same lobes are left behind in plot (c). Since this signal is therefore not plasmon emission (since no plasmon emission can occur from a planar device), to obtain the cleanest plasmon signal, the P-S planar subtraction (b) is removed from the P-S grating subtraction (a) to yield (P-S)grating-(P-S)planar, which we give the moniker "plasmon enhanced EL intensity", shown in plot (c).

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic emissive device comprising:
    a substrate;
    a corrugated outcoupling layer disposed over the substrate;
    a first electrode disposed over the corrugated outcoupling layer;
    an emissive stack disposed over the first electrode and comprising an organic emissive material configured to emit light having a peak wavelength $\lambda$;
    a second electrode disposed over the emissive stack; and
    at least one additional layer selected from a group consisting of:
        an underlayer disposed below the first enhancement layer, the underlayer having a thickness not more than 4 n$\lambda$, wherein n is a refractive index of the underlayer; and
        an overlayer disposed over the first enhancement layer, the overlayer having a thickness not more than 4 m$\lambda$, wherein m is a refractive index of the overlayer;
    wherein at least one layer in the organic emissive device functions as a first enhancement layer in the device and comprises a plasmonic material exhibiting surface plasmon resonance that non-radiatively couples to the organic emissive material and transfers excited state energy from the organic emissive material to a non-radiative mode of surface plasmon polaritons of the enhancement layer.

2. The device of claim 1, wherein at least one of the first electrode, the second electrode, and the first enhancement layer comprises a material independently selected from the group consisting of: Au, Ag, Mg, Al, Pt, In, Ir, Ni, Cu, W, Ta, Fe, Cr, Ga, Rh, Ti, Ru, Pd, Bi, Ca, a small organic molecule, a polymer, $SiO_2$, $TiO_2$, $Al_2O_3$, an insulating nitride, Si, Ge, an insulating fluoride, ZnS, ZnSe, $MgF_2$, LiF, $MoO_3$, and a transparent conducting oxide.

3. The device of claim 1, wherein the first enhancement layer comprises a plurality of vertically-stacked layers of a plurality of dielectric materials.

4. The device of claim 3, wherein each layer of the plurality of vertically-stacked layers comprises one or more materials independently selected from the group consisting of: Au, Ag, Mg, Al, Pt, In, Ir, Ni, Cu, W, Ta, Fe, Cr, Ga, Rh, Ti, Ru, Pd, Bi, Ca, a small organic molecule, a polymer, $SiO_2$, $TiO_2$, $Al_2O_3$, an insulating nitride, Si, Ge, an insulating fluorides, ZnS, ZnSe, $MgF_2$, LiF, $MoO_3$, and a transparent conducting oxide.

5. The device of claim 1, wherein at least a portion of the emissive stack is corrugated.

6. The device of claim 1, wherein the first electrode is the first enhancement layer.

7. The device of claim 6, wherein the at least one additional layer comprises the underlayer disposed below the first enhancement layer.

8. The device of claim 7, wherein the at least one additional layer further comprises the overlayer disposed above the first enhancement layer.

9. The device of claim 6, wherein the at least one additional layer comprises the overlayer disposed above the first enhancement layer.

10. The device of claim 6, wherein the second electrode is a second enhancement layer comprising a plasmonic material exhibiting surface plasmon resonance that non-radiatively couples to the organic emissive material and transfers excited state energy from the organic emissive material to a non-radiative mode of surface plasmon polaritons of the second enhancement layer.

11. The device of claim 10, wherein the at least one additional layer comprises the underlayer disposed below the first enhancement layer.

12. The device of claim 11, wherein the at least one additional layer further comprises the overlayer disposed above the first enhancement layer.

13. The device of claim 10, wherein the at least one complementary layer comprises the overlayer disposed above the first enhancement layer.

14. The organic emissive device of claim 1, wherein the second electrode is the first enhancement layer.

15. The device of claim 14, wherein the at least one additional layer comprises the underlayer disposed below the first enhancement layer.

16. The device of claim 15, wherein the at least one additional layer further comprises the overlayer disposed above the first enhancement layer.

17. The organic emissive device of claim 14, wherein the at least one additional layer comprises the overlayer disposed above the first enhancement layer.

18. The device of claim 1, wherein the outcoupling layer comprises a plurality of layers of dielectric materials.

19. An organic emissive device comprising:
    a substrate;
    a corrugated outcoupling layer disposed over the substrate;
    a first electrode disposed over the corrugated outcoupling layer;
    an emissive stack disposed over the first electrode and comprising an organic emissive material configured to emit light having a peak wavelength $\lambda$;
    a second electrode disposed over the emissive stack; and at least one additional layer selected from a group consisting of:
- an underlayer disposed below the first enhancement layer, the underlayer having a thickness not more than 4 $n\lambda$, wherein n is a refractive index of the underlayer;
- an overlayer disposed over the first enhancement layer, the overlayer having a thickness not more than 4 $m\lambda$, wherein m is a refractive index of the overlayer; and
- a third electrode disposed adjacent to the corrugated outcoupling layer and separated from each of the first electrode and the second electrode by at least one intervening layer;

wherein at least one layer in the organic emissive device functions as a first enhancement layer in the device and comprises a plasmonic material exhibiting surface plasmon resonance that non-radiatively couples to the organic emissive material and transfers excited state energy from the organic emissive material to a non-radiative mode of surface plasmon polaritons of the enhancement layer.

20. The device of claim 19, wherein the corrugated outcoupling layer has a voltage-tunable refractive index modulated by the third electrode.

* * * * *